United States Patent
Mak et al.

(10) Patent No.: US 8,019,290 B2
(45) Date of Patent: Sep. 13, 2011

(54) TWO-STEP CHANNEL SELECTION FOR WIRELESS TRANSMITTER FRONT-ENDS

(75) Inventors: Pui-In Mak, Macau (CN); Seng-Pan U, Macau (CN); Rui Paulo da Silva Martins, Macau (CN)

(73) Assignee: University of Macau, S.J. Taipa, Macau (CN)

( * ) Notice: Subject to any disclaimer, the term of this patent is extended or adjusted under 35 U.S.C. 154(b) by 482 days.

(21) Appl. No.: 12/203,837

(22) Filed: Sep. 3, 2008

(65) Prior Publication Data

US 2008/0318534 A1    Dec. 25, 2008

Related U.S. Application Data

(62) Division of application No. 11/213,613, filed on Aug. 26, 2005, now Pat. No. 7,529,322.

(51) Int. Cl.
  H04B 1/02    (2006.01)
  H04B 1/04    (2006.01)
  H01Q 11/12    (2006.01)

(52) U.S. Cl. .......... 455/91; 455/103; 455/113; 455/118; 375/295

(58) Field of Classification Search ............ 455/76, 455/86–87, 91, 102–103, 110–113, 118, 455/313–315, 323; 375/295, 298
See application file for complete search history.

(56) References Cited

U.S. PATENT DOCUMENTS

| | | | |
|---|---|---|---|
| 5,937,341 A | 8/1999 | Suominen | 455/324 |
| 6,477,182 B2 * | 11/2002 | Calderone | 370/481 |
| 6,658,237 B1 * | 12/2003 | Rozenblit et al. | 455/83 |
| 6,766,178 B1 * | 7/2004 | Damgaard et al. | 455/552.1 |
| 7,099,402 B2 * | 8/2006 | Mollenkopf | 375/295 |
| 7,167,528 B2 * | 1/2007 | Chen et al. | 375/302 |
| 7,167,686 B2 * | 1/2007 | See et al. | 455/77 |
| 7,239,855 B2 * | 7/2007 | Matsui et al. | 455/127.1 |
| 7,260,418 B2 * | 8/2007 | Natarajan et al. | 455/562.1 |
| 2004/0259518 A1 * | 12/2004 | Aktas et al. | 455/323 |
| 2006/0141952 A1 * | 6/2006 | Kung et al. | 455/102 |
| 2006/0160492 A1 | 7/2006 | Jensen | 455/76 |

OTHER PUBLICATIONS

Abidi, A. A., et al., "RF CMOS Comes of Age," *IEEE Journal of Solid-State Circuits*, vol. 39, No. 4, pp. 549-561, Apr. 2004.
Alzaher, H., et al., "A CMOS Highly Linear Cannel-Select Filter for 3G Multistandard Integrated Wireless Receivers," *IEEE Journal of Solid-State Circuits*, vol. 37, pp. 27 37, Jan. 2002.
Choi, P., et al., An Experimental Coin-Sized Radio for Extremely Low Power WPAN (IEEE 802.15.4) Application at 2.4 GHz., *IEEE Journal of Solid-State Circuits*, vol. 38., No. 12, pp. 2258-2268, Dec. 2003.
Couch II, L., et al., Digital and Analog Communication Systems, Prentice Hall, Inc. 1987.
Crols, J., et al., "A Single-Chip 900 MHz CMOS Receiver Front-End with a High Performance Low-IF Topology," *IEEE Journal of Solid State Circuits*, vol. 30, No. 12., pp. 1483-1492, Dec. 1995.

(Continued)

*Primary Examiner* — Simon Nguyen
(74) *Attorney, Agent, or Firm* — Ladas & Parry, LLP

(57) ABSTRACT

A reconfigurable multimode transmitter is disclosed, operating in accordance with a two-step channel selection. The first step provides for a fine channel selection and upconversion of a desired channel to either positive or negative IF. The second step is a coarse channel selection and upconversion of a desired channel to the RF. The receiver and transmitter can be used in a transceiver.

12 Claims, 13 Drawing Sheets

OTHER PUBLICATIONS

Crols, J., et al., "An Analog Integrated Polyphase Filter for a High Performance Low IF Receiver," *Proceedings of VLSCI Circuits Symposium*, Kyoto, pp. 87-88, Jun. 1995.

Darabi, H., et al., "A Dual-Mode 802.11b/ Bluetooth Radio in 0.35 μm CMOS," *Int. Solid State Circuits Conference*. (ISSCC) Digest, pp. 86-87, Feb. 2003.

Durham, A. M., et al., "Circuit Architecture for High Linearity Monolithic Continuous-Time Filtering," *IEEE Trans. on Circuits and Systems-II*, vol. 39, No. 9, Sep. 1992.

Ieong, K.H., et al., "A Frequency Up-Conversion and Two-Step Channel Selection Embedded CMOS D/A Interface," *Proc. of IEEE Int. Symposium on Ciurcuits and Systems* (ISCAS), Japan, May 2005, pp. 392-339.

Kadoyama, T., et al., "A Complete Single-chip GPS Receiver with 24-mW Radio in 0.18 μm CMOS," *IEEE Journal of Solid State Circuits*, vol. 39, No. 4, pp. 562-568, Apr. 2004.

Mak, P.I., et al., "A Novel IF Channel Selection Technique BY Analog-Double Quadrature Sampling for Complex Low-IF Receivers,"*Proceedings of Int. Conf. on Communication Technology* (ICCT), vol. 2, pp. 1231-1241, Apr. 2003.

Mak, P.I., et al., "Two-Step Channel Selection—A novel Technique for Reconfigurable Multistandard Transceiver Front-Ends," IEEE Trans. on CAS-I, vol. 52, No. 7, pp. 1302 1315, Jul. 2005.

Mak, P.I., et al.,"A Programmable Switched-Capacitator A-DQS Frequency Downconverter for Two-Step Channel Selection Wireless Receiver," Proceedings of the 5th IEEE Int. Conference on ASIC (ASICON), vol. 1, pp. 573-576, Oct. 2003.

Mak, P.I., et al., "I/Q Imbalance Modeling of Quadrature Wireless Transceiver Analog Frot-Ends Ends SIMULINK," In Proc. of IEEE Int. Conference on Vehicular Technology (VTC), vol. 4, pp. 2371-2374, Oct. 2003.

Mak, P.I., et al.,"Frequency-Downconversion and IF Channel Selection A-DQS Sample and Hold Pair for Two-Step-Channel-Select Low-IF Receiver," Procedures of IEEE Int. Conf. on Electronics, Circuits and Systems (ICECS), pp. 479-482, Dec. 2003.

Mak, P.I., et al., "A Low-IF/Zero-IF Reconfigurable Receiver with Two-Step Channel Selection Technique for Multistandard Applications," Procedures of IEEE Int. Symp. Symposium on Circuits and Systems (ISCAS), pp. 417-420, May 2004.

Mak, P.I., et al., "An I/Q-Multiplexed and OTA-Shared CMOS Pipelined ADC With an a DQS S/H Front-End for Two-Step-Channel-Select Low-IF Receiver," Proceedures of IEEE Int. Symposium on Circuits and Systems (ISCAS) pp. 1068-1071, May 2004.

Mak, P.I., et al., "A Front-to-Back End Modeling of I/Q Mismatch Effects in a Complex-IF Receiver for Image-Rejection Enhancement," Proceedures of IEEE Int. Conference on Electronics, Circuits and Systems (ICECS), pp. 631-364, Dec. 2003.

Mak, P.I., et a., "Two-Step Channel Selection Technique by Programmable Digital Double Quadrature Sampling fro Complex Low-IF Receivers," IEEE Electronics Letters, vol. 39, No. 11, pp. 825-827, May 2003.

Pun, K.P., et al., "Quadrature Sampling Schemes With Improved Image Rejection," IEEE Trans. on Circuits and Systems-II, vol. 50, No. 9, pp. 641-648, Sep. 2003.

Razavi, B., et al.,"Architectures and Circuits for RF CMOS Receivers," Proc. of Custom Integrated Circuits Conference, (CICC), pp. 393-400, May 1998.

Rogin, J., et al., "A 1.5-V 45 -mW direct-conversion WDM Reciever IC in 0.13- μm CMOS," IEEE Journal of Solid State Circuits, vol. 38, No. 12, pp. 2239-2248, Dec. 2003.

Rudell, J.C., et al., "A 1.9-GHz Wide Band IF Double Conversion CMOS Receiver for Cordless Telephone Applications," IEEE Journal of Solid State Circuits, vol. 32, No. 12, pp. 2071-2088, Dec. 1997.

Ruhlicke, Y., et al., "A Highly Integrated, Dual-Band, Multi-Mode Wireless LAN Transceiver," Proc. of Euro. Solid State Circuits Cinf. (ESSCIRC), pp. 229-232, Sep. 2003.

Ryynanen, J., et al., "A Single-Chip Multi-Mode Receiver for GMS900, DCS1800, PCS1900, and WCDMA," IEEE Journal of Solid-State Circuits, vol. 38, No. 4, pp. 594 602, Apr. 2003.

Samadian,S., et al.,"Low Power Phase Quantiziing Demodulators for a Zero-IF Bluetooth Receiver," IEEE Symposium on Radio Frequency Integrated Circuits (RFIC), pp. 49-52, Jun. 2003.

Shen, D.H., et al., "A 900-MHz RF Front-End with Integrated Discrete-Time Filtering," IEEE Journal of Solid-State Circuits, vol. 31, No. 12,Dec. 1996.

Sheng, W., et al., "A 3-V, 0.35- μm CMOS Bluetooth Receiver IC," IEEE Journal of Solid State Circuits, vol. 38, No. 1, pp. 30-42, Jan. 2003.

Steyaert, M., et al., "A 2-V CMOS Cellular Transceiver Front-End," *IEEE Journal of Solid-State Circuits*, vol. 35, No. 12, pp. 1895-1907, Dec. 2000.

Weldon, J., et al, "A 1.75-GHz Highly Integrated Narrow-Band CMOS Transmitter With Harmonic-Rejection Mixers," *IEEE Journal of Solid-State Circuits*, vol. 36, pp. 2003, Dec. 2001.

Zannoth, M., et al., "A Highly Integrated Dual-Band Multimode Wireless LAN Transceiver," *IEEE Journal of Solid-State Circuits*, vol. 39, No. 7, pp. 1191-1195, Jul. 2004.

\* cited by examiner

TABLE I. SUMMARY OF KEY PHY LAYER SPECIFICATIONS OF 2.4-GHZ ISM BAND FHSS STANDARDS.

| Standard | Channel spacing | Data rate | Distance | Hop rate |
|---|---|---|---|---|
| Bluetooth | 1 MHz | 1 Mbps | 10 M | 1600 Hop/s |
| HomeRF | 5 MHz | 5,10 Mbps | 100 M | 75 Hop/s |
| IEEE802.11FH | 1 MHz | 1,2 Mbps | 150 M | 2.5 Hop/s |

FIG. 6
(Prior Art)

TABLE II. COMPARISONS OF DIFFERENT HIGH-INTEGRATED RECEIVER AND TRANSMITTER ARCHITECTURES.

| RECEIVERS | | | | | | | |
|---|---|---|---|---|---|---|---|
| Architecture | Image Susceptibility | 1/f-Noise and DC-Offset Susceptibility | No. of Mixer | No. of Frequency Synthesizer | No. of Local Oscillator | No. of Filter and Types | Overall Feasibility |
| Zero-IF [2] | Low | High | 2 at RF | 1 at RF | 1 at RF | 2 LPFs | High |
| Low-IF [5] | Medium | Low | 2 at RF, 4 at Low IF | 1 at RF | 1 at RF | 1 C-BPF | Low |
| Wide-band IF [20] | Medium | Low | 1 at high IF, 2 at Low IF | 1 at IF | 1 at RF, 1 at IF | 2 LPFs | Medium |
| Low-IF /Zero-IF Reconfigurable (Proposed) | Low [1] | Low / High | 2 at RF [2] | 1 at RF [2] | 1 at RF [2] | 1 C-BPF / 2 LPFs Tunable | Very High |
| TRANSMITTERS | | | | | | | |
| Architecture | Interference Susceptibility [3] | LO-Pulling Susceptibility | No. of Mixer | No. of Frequency Synthesizer | No. of Local Oscillator | No. of Filter and Types | Overall Feasibility |
| Direct-up [1] | Medium | High | 2 at RF | 1 at RF | 1 at RF | 2 LPFs | Medium |
| Two-step-up [5] | Medium | Low | 2 at RF, 4 at Low IF | 1 at RF | 1 at RF, 1 at IF | 2 LPFs | Low |
| Direct-up /Two-step-up Reconfigurable (Proposed) | Low [4] | High / Medium | 2 at RF [2] | 1 at RF [2] | 1 at RF [2] | 2 LPFs / 1 C-BPF Tunable | High |

FIG. 20

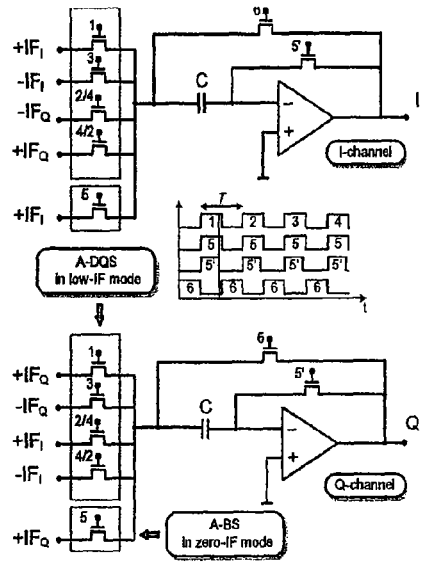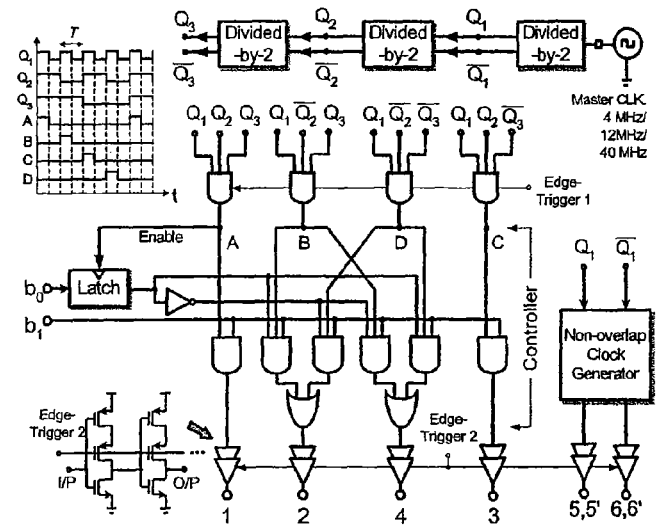
FIG. 17(a)   FIG. 17(b)
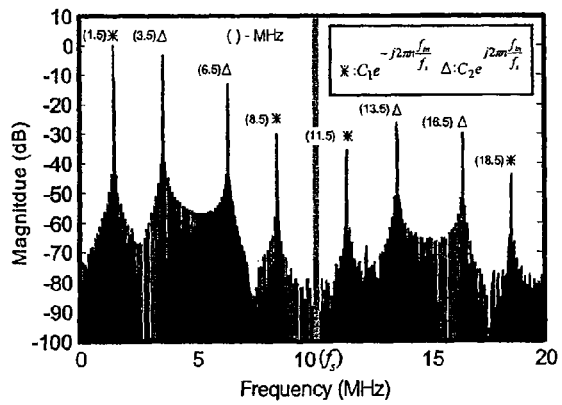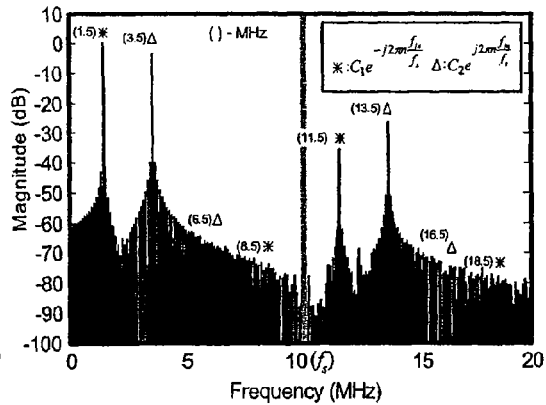
FIG. 18(a)   FIG. 18(b)

TWO-STEP CHANNEL SELECTION FOR WIRELESS TRANSMITTER FRONT-ENDS

CROSS-REFERENCE TO RELATED APPLICATION

This application is a division of U.S. patent application Ser. No. 11/213,613, filed on Aug. 26, 2005, the disclosure of which is incorporated herein by reference.

BACKGROUND

1. Field

The present disclosure relates to circuits and systems for wireless communications, in particular, to a two-step channel selection method comprising a coarse and a fine channel selection for wireless transceiver front-ends in acquisition of channels from different standards.

2. Related Art

In addition to the aggressive requests of high integration and low-power dissipation, multistandard compliance is an important feature of emerging wireless transceiver integrated circuits (ICs) to allow seamless interswitch one terminal through diverse cellular and wireless-network communication standards.

Prospective receiver analog front-ends (AFEs) for attaining those requirements are presently restricted to zero-intermediate frequency (zero-IF) and low-IF architectures, whose operating principles can be pictorially described by the complex-signal spectral-flow (CSSF) illustrations in FIGS. 1(a) and (b), respectively. The basic components include a mixer, a frequency synthesizer (FS), a local oscillator with in-phase (I) and quadrature (Q) outputs (I/Q-LO), a channel-select filter (CSF), and an analog-to-digital converter (A/D). Off-chip and power-hungry image-reject filters, strongly required in superheterodyne architectures, are no longer necessitated in either zero-IF or low-IF architecture, since image rejection is realized by signal cancellation in two parallel-operating channels (I and Q). However, when multistandard compatibility needs to be addressed, especially for narrowband-wideband-mixed applications, zero-IF and low-IF implementations will encounter obstacles.

Zero-IF receivers are highly appropriate for both wideband or spread-spectrum access standards such as WCDMA [2] and IEEE 802.11a/b/g [3], because the most problematic flicker noise and DC offset are superimposed only on a very small fraction of the desired channel. Thus, without excessive degradation in signal quality, those interferences can be suppressed, for instance, through capacitive coupling. Moreover, the image crosstalk due to unavoidable channel mismatch (namely, I/Q mismatch [4]) will be at a minimum level, as the image is only the upper (or lower) sideband of the one desired.

In contrast, for narrowband standards the removal of flicker noise and DC offset significantly damages the channel spectra since spectrally efficient modulations generally peak at DC. To alleviate those pitfalls, a low-IF architecture [5] was provided for GSM applications by downconverting the desired channel, in frequency, only to the vicinity of DC. Such a solution exhibits comparable integratability as zero-IF receiver and it is therefore extensively used in many narrowband applications today, such as Bluetooth [6], GPS [7], DCS-1800 [8] and IEEE 802.15.4 [9]. Low-IF architectures are efficient mainly because the image-rejection requirement at relatively low IF is still a practical value. However, those architectures are very unfeasible in applications like WCDMA. The adjacent channel selectivity (ACS) test case of WCDMA indicates that, in zero-IF operation, the required image rejection is 25 dB, whereas in low-IF operation the minimum value is 75 dB.

The above architectural boundaries are the main rationales for restricting zero-IF architectures to wideband applications, whereas low-IF architectures are generally designed for narrowband applications. However, today's wireless systems typically are a mixture of narrowband and wideband, such as: WCDMA with GSM [10], or Bluetooth with IEEE 802.11b [11]. To address the demand, a low-IF/zero-IF reconfigurable receiver appears as a new alternative, since the radio-frequency (RF) AFEs of zero-IF and low-IF architectures are theoretically identical [see FIGS. 1(a) and (b)]. For some standards that share the same spectrum, e.g., 2.4-GHz industrial-scientific-medical (ISM) band, the radio can be shared. The remaining inconsistencies predominantly rely on the IF-to-baseband part, so that two dedicated IF-to-baseband chains for zero-IF and low-IF operations are still essential in the past designs shown in [11] and [12]. The solutions provided by those designs, however, inefficiently enlarge the area required and may not be possible if more and more standards need to be complied with, requiring exploration of new techniques to maximize reusability of functional blocks.

In the following paragraphs, the principles of the conventional channel-selection techniques will be presented and their advantages and disadvantages discussed.

Almost all voice- and data-centric standards utilize (or partially utilize) frequency-division multiple-access (FDMA) to divide the entire frequency band into channels for multiple users. The mission of the AFE is to retrieve the sought channel from the air, amplify it and downconvert it from RF to baseband for demodulation. This process is well known in superheterodyne receivers: the sought channel is gradually downconverted and filtered from RF to different IFs, and finally to baseband. On the other hand, image-reject receivers use a series of steps for channel selection, which usually comprise the combination (with possible permutations) of the 3 main blocks, the frequency synthesizer (FS), the local-oscillator (LO) and the channel-select filter (CSF). Depending on the operating frequency (i.e., RF or IF) and movability of the blocks, image-reject receivers can typically be represented by the two alternative architectures discussed in the following paragraphs.

A. Fixed $LO_{RF}$+Varying IF

FIG. 2(a) shows a first type of channel-select architecture [13], where a fixed-frequency RF local oscillator ($LO_{RF}$) is used to perform a large step of RF-to-IF downconversion. After that, the desired channel is extracted at a relatively low-IF value by using a center-frequency-controllable CSF. The sought channel is then downconverted to baseband by way of a further frequency synthesizer and local oscillator. A first advantage of this structure is that it highly relaxes the phase-noise requirement of the RF local oscillator because it is free from locking. A second advantage is due to the fact that channel-select filtering is performed prior to the IF-to-baseband downconversion, so that the operating frequency and the phase-noise requirements of the IF frequency synthesizer and local oscillator can be highly reduced.

However, the main bottleneck of this permutation is that a broadband-tunable filter is required, thus requiring an accurate control of the center frequency. For instance, in a Bluetooth environment, if the entire band (79 channels in total) is downconverted to baseband in the first mixing, a 1-MHz bandpass filter with 79 different center frequencies in a range of 80 MHz (−40 to 40 MHz) is needed. Moreover, the agility of the filter should be high to also allow frequency hopping.

With such rigid constraints, it would be very difficult to apply this method in modern applications. However, a special case of this architecture is known for DECT applications, namely a wideband IF double-conversion receiver [14] which employs a fixed-frequency local oscillator cooperating with a wideband lowpass filter in the first downconversion, whereas channel selection is shifted to the second IF. In this way, the operating frequency of the succeeding stages can be reduced. However, this benefit comes at the expense of an increase in the linearity requirements of the wideband lowpass filter to prevent channel-to-channel intermodulation.

B. Varying $LO_{RF}$+Fixed IF

FIG. 2(b) shows a second type of channel-select architecture [15] that uses a RF frequency synthesizer and a $LO_{RF}$ to cover all possible channel positions in the RF frequency band of interest. The desired channel is then downconverted to baseband, where only a fixed channel-select filter is needed. This structure is relatively appropriate for state-of-the-art IC designs since current frequency synthesizers (based on PLL architectures) show results at operating frequencies in the GHz range with adequate performance. On the other hand, a fast-settling and broadband-tunable oscillator is much easier to implement than its filter counterpart, and a baseband filter is much simpler and more power-efficient than a bandpass one. The presence of these compromised features confirms the suitability of this type of architecture for almost all kinds of image-reject receivers (e.g., Hartley, low-IF, Weaver and zero-IF) [15].

In summary, the two traditional architectures presented above include variable circuit blocks either at the IF [CSF of FIG. 1(b)] or RF [RF FS & I/Q-LO of FIG. 1(b)], each architecture having its own disadvantages.

SUMMARY

According to a first aspect, a two-step channel selection apparatus is disclosed, comprising: a radio frequency to intermediate frequency (IF) downconverter comprising a local oscillator; and a frequency synthesizer associated with the local oscillator to select a first desired channel and a second desired channel, the first and second desired channels being an image of each other, wherein the frequency synthesizer has a step size larger than one channel spacing.

According to a second aspect, a reconfigurable receiver capable of operating at a zero intermediate frequency (zero-IF) mode or a low intermediate frequency (low-IF) mode is disclosed, the receiver comprising: a radio frequency to intermediate frequency downconverter and a first local oscillator to perform radio frequency to intermediate frequency downconversion; and a frequency synthesizer associated with the first local oscillator, to select a channel in the zero-IF mode and a plurality of channels in the low-IF mode, said plurality of channels comprising a first desired channel and a second desired channel, the first and second desired channels being an image of each other, wherein the frequency synthesizer has a step size larger than one channel spacing.

According to a third aspect, a reconfigurable transmitter capable of operating in a direct-up mode or a two-step-up mode is disclosed, wherein in the direct-up mode the intermediate frequency IF=0, the transmitter comprising: a baseband to intermediate frequency upconverter to perform baseband to intermediate frequency upconversion of a signal to either a positive IF or negative IF in the two-step-up mode, the upconverter being bypassed in the direct-up mode; an intermediate frequency to radio frequency upconverter and a local oscillator to perform intermediate frequency to radio frequency upconversion; and a frequency synthesizer having a step size larger than one channel spacing.

According to a fourth aspect, a multimode receiver capable of operating at multiple intermediate frequencies is disclosed, comprising: a radio frequency to intermediate frequency downconverter and a first local oscillator to perform radio frequency to intermediate frequency (IF) downconversion; a frequency synthesizer associated with the first local oscillator, to select a plurality of channels in a first frequency mode, said plurality of channels comprising a first desired channel and a second desired channel, the first and second desired channels being an image of each other, wherein the frequency synthesizer has a step size larger than one channel spacing; and a second local oscillator and an intermediate frequency to baseband downconverter to perform intermediate frequency to baseband downconversion of the first desired channel or the second desired channel, wherein the downconverter is controllable in the first frequency mode and adapted to be bypassed in a second frequency mode.

The present disclosure proposes both architectural and circuit techniques to synthesize a low-IF/zero-IF reconfigurable receiver and its complementary direct-up/two-step-up reconfigurable transmitter in one chain. Such architectures are originated from a two-step channel-selection (2-SCS) technique, which aims at relaxing both phase-noise and locking-time requirements of the RF phase-locked loop (PLL) frequency synthesizer through both analog [16] and digital [17] techniques, extending the previous concept of using low-IF/zero-IF modes in the receiver path [18]-[20], to allow a practical architecture implementation [1], as well as novel direct-up/two-step-up modes in a transmitter path [1, 21]. At the circuit level, new structures comprising a triple-mode channel-select filter and multifunctional sampling-mixer schemes are also addressed.

The IC implementation of the proposed channel-selection technique in accordance with the present disclosure comprising a frequency-downconversion I/Q-multiplexer [18], which can also be embedded in a pipelined analog-to-digital converter (A/D) for digitization of both I and Q channels in one chain [22], will not be addressed here for brevity, but it is easily implementable by a person skilled in the art upon reading of the present disclosure.

BRIEF DESCRIPTION OF THE DRAWINGS

FIG. 6 shows a summary of key PHY specifications of the 2.4-GHz ISM band and FHSS standards.

FIGS. 17(a) and 17(b) show (a) a multifunctional sampling mixer scheme and (b) a channel/mode selection embedded clock-phase generator.

FIGS. 18(a) and 18(b) show simulated PSDs of (a) I channel and (b) |I+jQ|.

FIG. 20 shows a comparison between different receiver and transmitter architectures.

DETAILED DESCRIPTION

The technique in accordance with the present disclosure uses a partition of the channel selection process between the RF and IF AFEs, such that only a coarse selection is necessary at the RF and a fine selection will be completed at the IF. The key to implementing this technique in an efficient manner is a new concept of image.

It is well-known that image is an unwanted interference in frequency conversion (either up or down). In image-reject receivers, after quadrature downconversion and based on complex-signal analysis, the desired channel and its first adjacent become the image of each other with the relationship, $|f_{desired} - f_{image}| = 2IF$, where $f_{image}$ and $f_{desired}$ are the frequencies of the image and the desired channels, respectively. Moreover, they will be located at the same IF but with a complex conjugate representation.

However, should the IF AFE be able to flexibly select either the desired channel or its image, channel selection could be accomplished without any prerequisite needed in the radio part. In order to allow such technique to be implemented, channels adjacent to the desired channel should represent the image of the desired channel. The applicants have observed that this requirement is satisfied when $f_{IF} = (n+0.5)$ CS, where n=0, 1, 2, 3 . . . and CS represents the channel spacing.

Figure 1A:
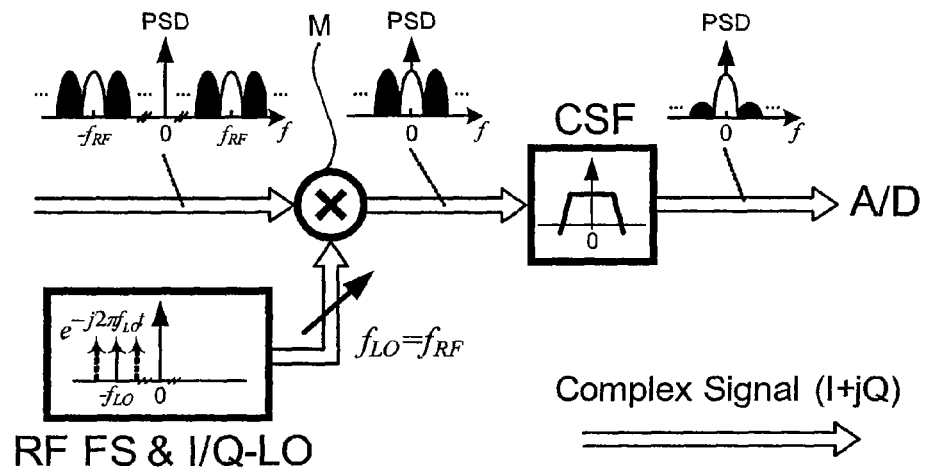
FIGS. 1(a) and 1(b) show CSSF illustrations of zero-IF and low-IF architectures.
Figure 1B:
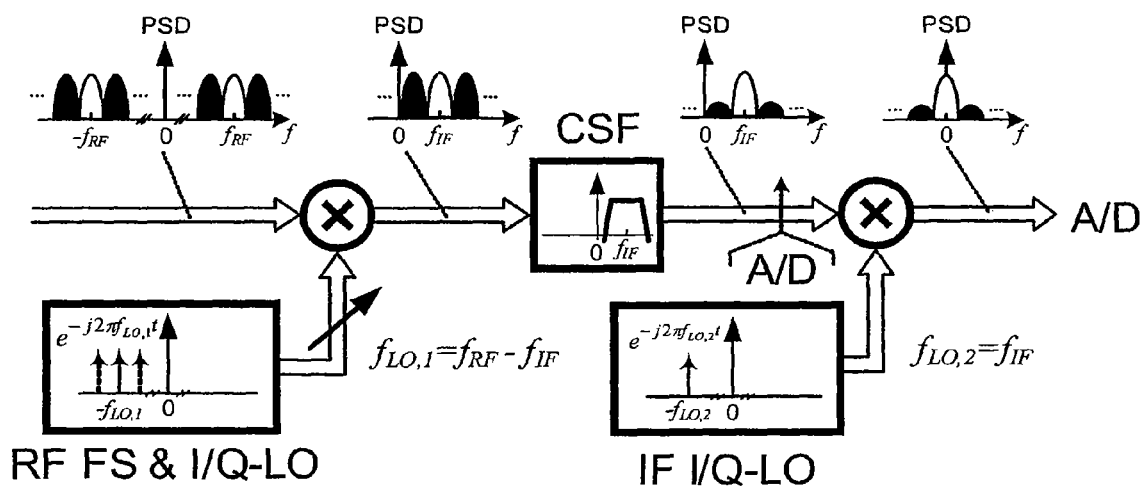
Figure 2A:
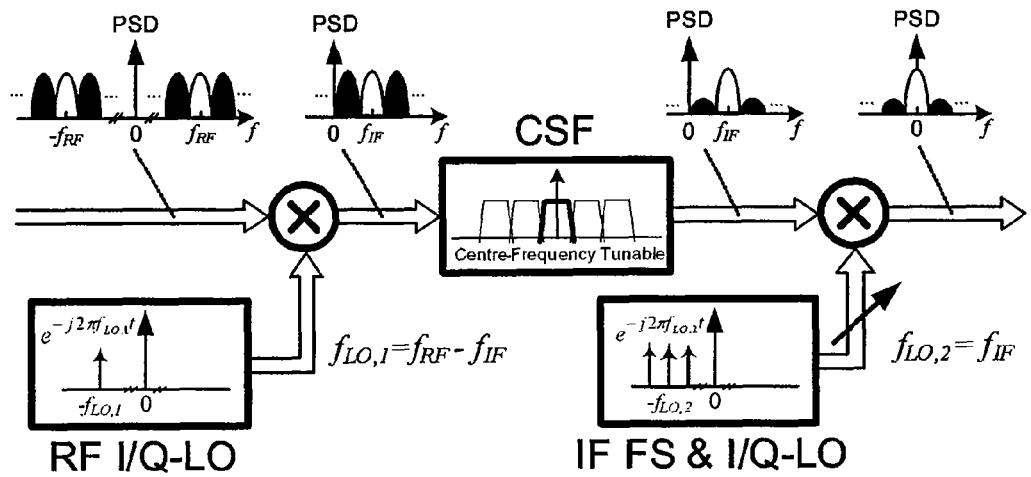
FIGS. 2(a) and 2(b) show CSSF illustrations of conventional channel-selection methods.
Figure 2B:
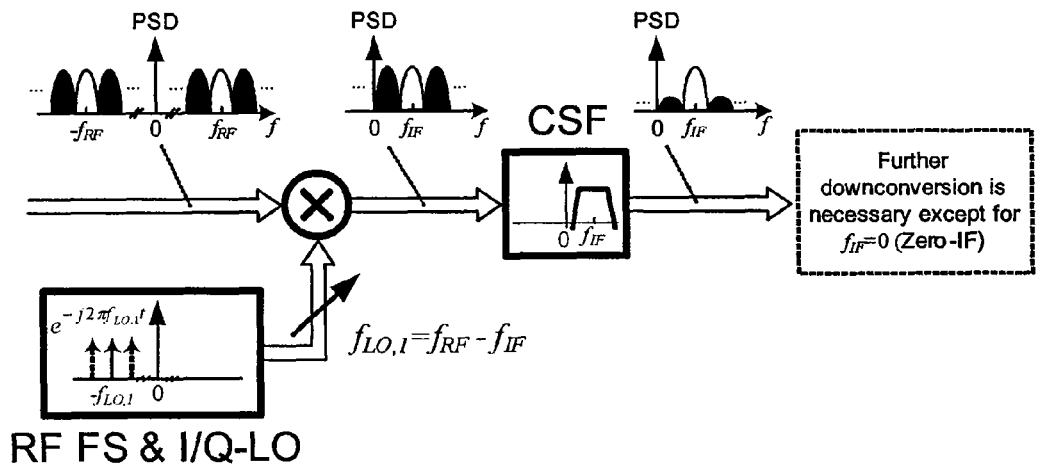
Figure 3:
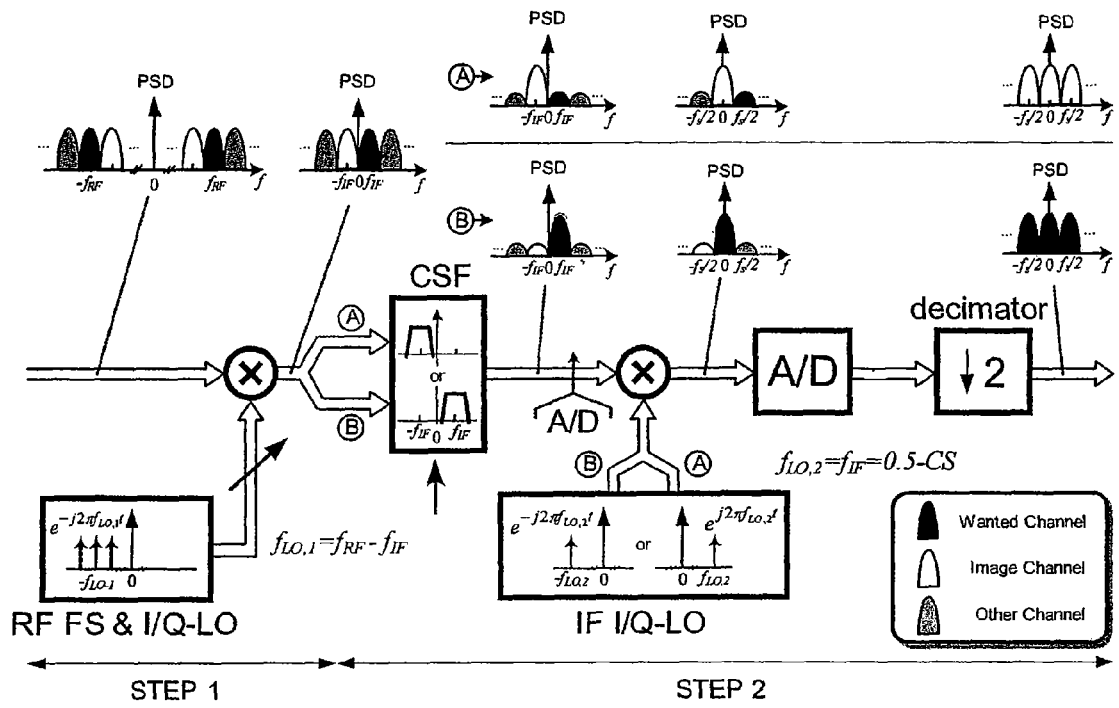
FIG. 3 shows a CSSF illustration of a low-IF receiver in accordance with the present disclosure.

FIG. 3 shows an embodiment of the present disclosure with $f_{IF} = 0.5$ CS. The embodiment of FIG. 3 provides for two different IF-to-baseband operation modes, labeled as A and B, where the CSF has a tunable center frequency at either +IF or −IF, and the IF LO provides not only the conventional 0° and 90°, but also 180° and 270°, to allow a selection between the upper and lower sidebands. The A/D shown in FIG. 3 can be placed prior or after the secondary mixing to trade the A/D conversion rate with the mixer implementation (i.e., analog or digital). The following operations, common to the A and B operation modes, comprise decimation and image elimination through a simple digital filter.

The complete operation presented in FIG. 3 implies an enlargement in the frequency synthesizer step size. If an integer-N frequency synthesizer is employed for RF-to-IF downconversion, a larger step-size (2-channel spacing in the case shown in FIG. 3) implies that a higher reference frequency can be utilized. Thus, the loop bandwidth of the PLL is also enlarged by the same factor to shorten the PLL settling time and reduce the phase noise from the local oscillator, without the stability and overshoot penalties. Moreover, a higher reference frequency reduces the division ratio in the modulus, so as the phase noise contributed by the reference frequency. Furthermore, fewer locking positions also simplify the modulus anatomy, thereby enhancing the channel selection speed.

As explained in the following, the particular IF values in accordance with the present disclosure will not pose any limitation, rather, they will allow further advantageous features to be obtained. For the reconfigurable functionalities, only simple analog circuitry with digital control is needed.

IF Selection

Figure 4:
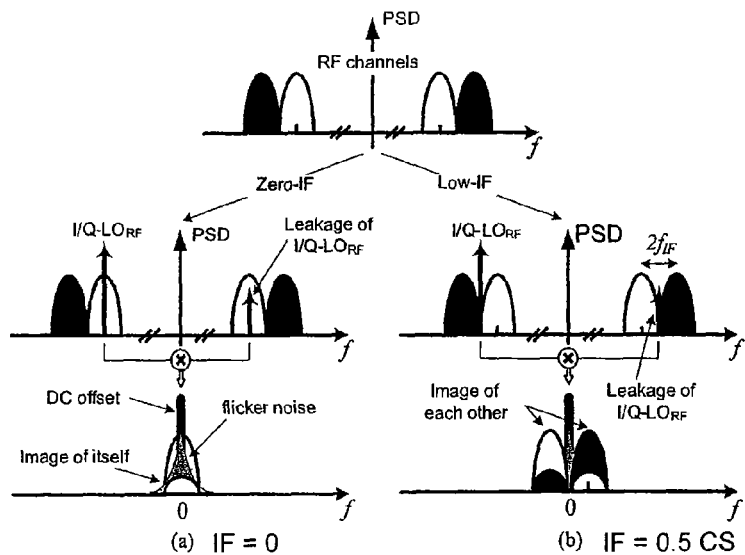
FIG. 4 shows a CSSF illustration of interference locations (with also I/Q-mismatch). (a) IF=0. (b) IF=0.5 channel spacing.

When IF=0 (i.e., zero IF), the image channel is the sideband of the desired signal itself as shown in FIG. 4(a). Although the image-rejection requirement is much relaxed, the low-frequency disturbance becomes very serious. Conversely, when the IF value gets higher, the required image rejection needs to be increased by the power difference between the image and the desired channel. To establish a good compromise between the low-frequency disturbance and the image interference, half channel-spacing (CS) can be chosen [5], as shown in FIG. 4(b).

This situation is especially true since in most wireless communication standards, the power of the adjacent channels increases with their frequency offset from the desired one. For example, in GSM (Bluetooth), the power of the first adjacent channel is only 18 dB (5 dB) higher than the desired one, the required image rejection is therefore only ~32 dB (~20 dB). Furthermore, the local oscillator will be locked in between every channel, and any unwanted LO leakage (e.g., through the substrate) does not degrade the signal quality. For the following CSF filter and A/D, however, their operating frequency has to be increased with the IF, implying higher power consumption. In general, up to four channel spacings would typically be used as the IF in image-reject receivers to satisfy many design tradeoffs [6]-[9]. This indicates that the proposed "n+0.5 channel spacing IF" with n=0 to 3 are feasible, and will not complicate the whole design.

Functional Blocks for the Second Step

As mentioned earlier, a RF frequency synthesizer can effectively be used for the first step. For the second step, the applicants propose to implement the channel-select filter by slightly modifying the structure of a conventional complex (or polyphase) filter. Further, the four-phased IF I/Q local oscillator can be embodied by a sampling-mixer arrangement making use of a programmable analog double-quadrature sampling technique [16]. In this way, the circuital overhead can be minimized.

To give a better description about the practicability of those functional blocks, an exemplary design and implementation in accordance with the present disclosure will be presented, based on a practical receiver design that will also be addressed. However, first of all, the advantages of the apparatus and method in accordance with the present disclosure will be illustrated.

Simplified Channel Up/Down-Conversion at RF

Figure 5:
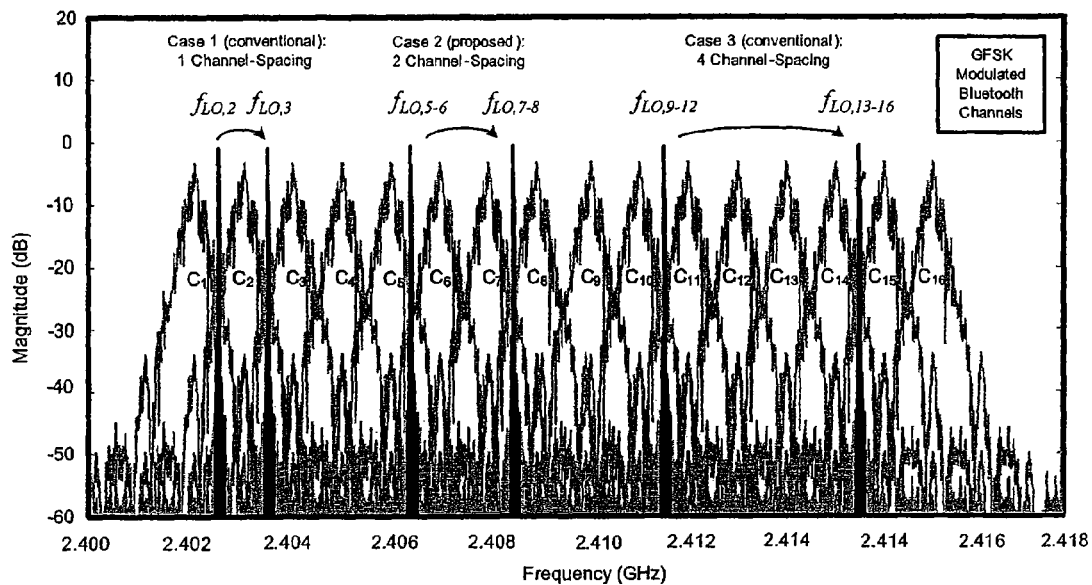
FIG. 5 shows LO locking positions with conventional structures (case 1) and with the novel proposed 2-SCS technique (cases 2 and 3).

The resulting simplification brought by the two-step channel selection in accordance with the present disclosure is shown in FIG. 5, which is based on a series of Bluetooth GFSK modulated channels that are being selected in the ISM band. To demonstrate the benefits of the proposed channel selection technique, three cases are considered and compared. Conventionally, in low-IF architecture, when the IF equals to 0.5 channel-spacing (case 1), each channel requires a local oscillator for downconversion. Differently, with the architecture in accordance with the present disclosure (case 2), the step-size of the frequency synthesizer is doubled, which implies that the division ratio (also called modulus) in the PLL will be halved since selection between $C_5$ and $C_6$, or $C_7$ and $C_8$ will be done at the IF.

The principles above referred can be further extended to other or multiple IF values. For instance, if both 0.5 and 1.5 channel-bandwidth spacings are considered (i.e., double IFs), the frequency synthesizer locking positions can then be changed to case 3, as also shown in FIG. 5. The channels $C_9$, $C_{10}$, $C_{11}$ and $C_{12}$ would be downconverted together by the RF local oscillator, $f_{LO,9-12}$. The selection between the 4 channels can be performed by a filter with 4 center-frequency positions, and a two-frequency-four-phased IF I/Q local oscillator.

The step-size of the frequency synthesizer can be extended to 4 channels spacing to further enhance the abovementioned relaxations. These features are important for frequency-hopping spread-spectrum (FHSS) systems such as Bluetooth, where the PLL settling time and phase noise always contribute a design trade-off. RF-to-IF channel partitioning is therefore a key way to make compromise between these two relevant PLL characteristics. Similarly, the abovementioned considerations are also valid for a two-step-up transmitter, allowing only one specification-relaxed frequency synthesizer and local oscillator to fulfill both the transmit and receive operations in a transceiver.

Facilitated Reconfigurations in Receiver and Transmitter

Another corollary of the two-step channel selection in accordance with the present disclosure is that when two (or four) narrowband channels are considered as a wideband one [in FIG. 5, cases 2 and 3], the local oscillator can now be located at the carrier of the wideband channel to perform direct frequency down (up) conversion, i.e., a zero-IF (direct-up) operation. Of course, the bandwidth (BW) of two (or four) narrowband channels is usually not exactly equal to a wideband channel, but the only cost to cure it would be that of a bandwidth-tunable lowpass filter, which is commonly used in multistandard compatible designs [23]. The IF-to-baseband downconversion in a low-IF receiver can be bypassed, thus resulting in a clear advantage for the receiver, which will be able to operate in low-IF mode for narrowband, or zero-IF mode for wideband. Similarly, use of this principle in a transmitter design will allow two modes of operation, i.e., two-step-up and direct-up.

To show how these two advantages smooth the progress of multistandard receiver design, an example in accordance with the techniques of the present disclosure will be presented next. For simplicity, two narrowband channels in low-IF mode will be considered as one wideband channel in zero-IF one.

Low-IF/Zero-IF Reconfigurable Receiver Design 1—Bluetooth/802.11FH/HomeRF

System-Design Overview

The three selected standards for the following embodiment are Bluetooth, IEEE 802.11FH and HomeRF [24]. Their key physical layer (PHY) specifications are summarized in the table of FIG. 6. As the table shows, their PHY are very similar and they operate in the same frequency band. Only one antenna and transceiver RF AFE will be sufficient to satisfy both transmit and receive operation requirements, thus allowing the implementation of compact and high-performance multistandard transceivers. Moreover, in the baseband AFE, automatic-gain control (AGC) blocks cooperating with both filters and A/Ds allow efficient equalization (likely required in 802.11FH and HomeRF), as well as coherent Gaussian frequency shift-keying (GFSK) demodulation in the digital signal processor (DSP). The remaining design challenges are associated with the different channel spacings and channel bandwidths of the selected standards, leading to several design tradeoffs or extra requirements on the functional blocks that can be highlighted as follows:

Interference by low-frequency disturbance or image—As mentioned before, the image problem can be considerably relaxed if the receiver is implemented in zero-IF, being also highly appropriate for the wideband HomeRF. However, flicker noise and DC offset problems call for AC-coupling or other offset-cancellation circuits, which will damage the narrowband Bluetooth and IEEE 802.11FH signals and lengthen the receiver settling time. Alternatively, employing a low-IF architecture to avoid the low-frequency disturbance, it would require an IF downconverter and an IF I/Q local oscillator, a RC-CR network or a clock-frequency divider for I/Q-phase generation, as well as of an increase in the required image rejection.

Frequency synthesizer and local oscillator—Although the three standards operate in the same spectrum, the need for different locking positions and step-sizes for different channel spacing is not eliminated. Moreover, due to the frequency-hopping spread-spectrum feature of these standards, agile frequency synthesizers and high spectral-purity oscillators are still required.

Channel-select filter—Independently of the architecture (low-IF or zero-IF), a filter with tunable bandwidth is required to comply with both narrowband and wideband channels.

Receiver Architecture

Figure 7:
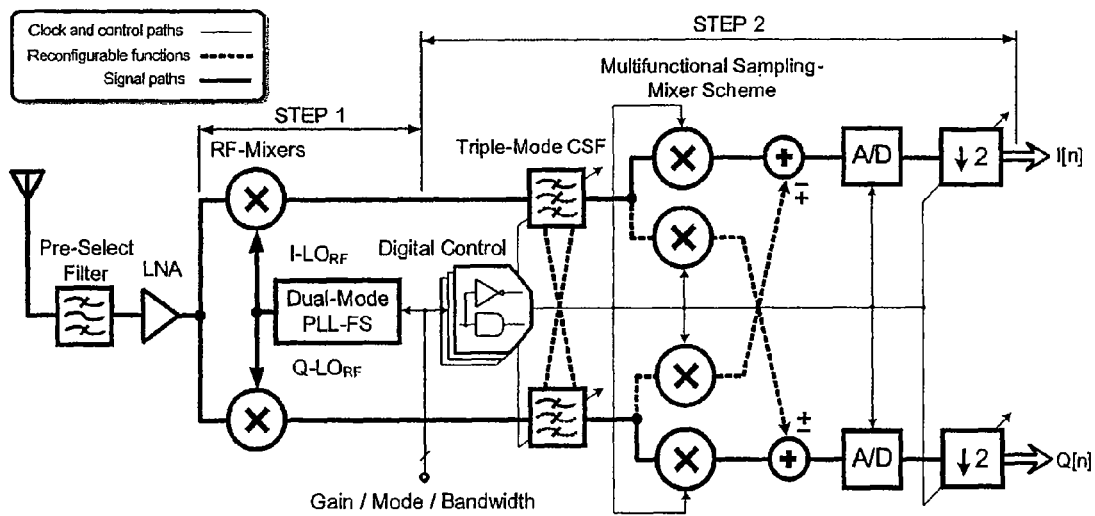
FIG. 7 shows a first embodiment of a low-IF/zero-IF reconfigurable receiver.
Figure 8:
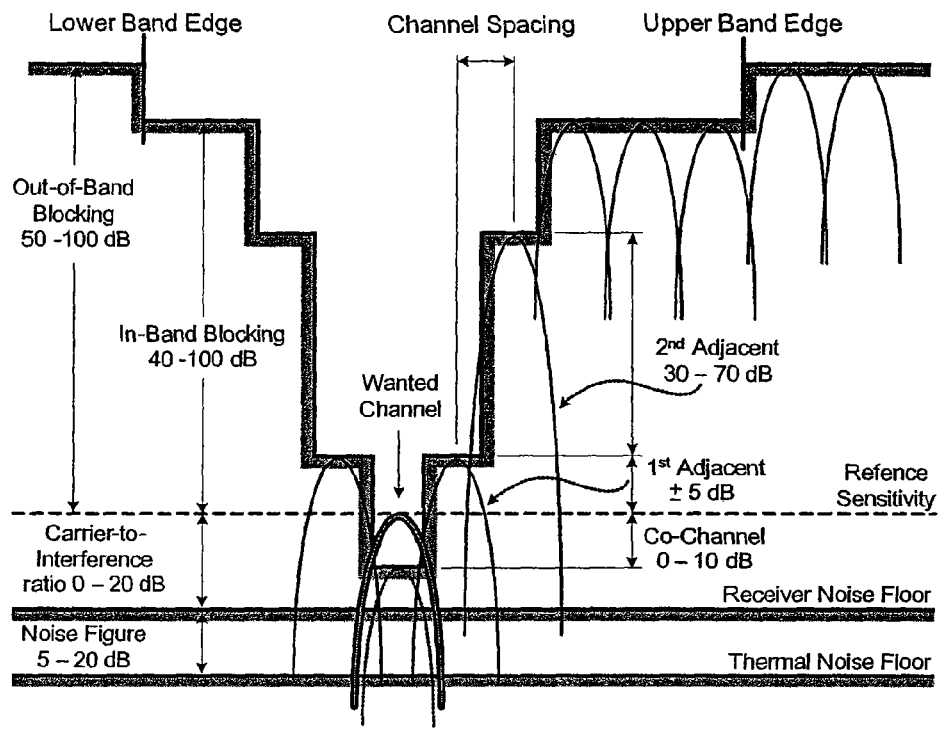
FIG. 8 shows the selectivity requirements of Bluetooth.

FIG. 7 shows a low-IF/zero-IF reconfigurable receiver, which allows the aforesaid trade-offs and requirements to be addressed. The receiver is adapted to operate in low-IF mode for Bluetooth and IEEE 802.11FH, and in zero-IF mode for HomeRF, and comprises the following functional blocks:

1) IF selection for different applications—The standard approval selectivity requirement is the main concern for IF selection. For Bluetooth, the power of the $1^{st}$ adjacent channel is comparable to the desired channel as shown in FIG. 8. To stay far from the low-frequency disturbance and to reach a compromise with the image rejection, a half-channel-spacing IF (0.5 CS) is a good choice. In case the low-frequency disturbance is still serious, higher IF values can be chosen at the expense, however, of an increased image-rejection requirement. In Bluetooth applications, half-channel-spacing is selected to match the proposed channel-selection technique on one hand, and minimize the low-frequency disturbance and the required image rejection (~20 dB) on the other. The situation is similar for IEEE 802.11FH. However, in the HomeRF scenario, its bandwidth is much wider and the frequency-hopping speed is slow, so that zero IF with offset cancellation is chosen.

Figure 9:
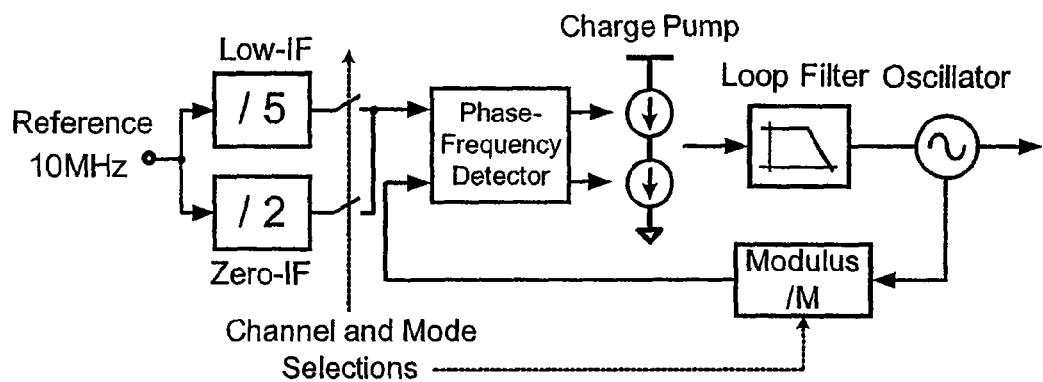
FIG. 9 shows a single-band dual-mode integer-N PLL-FS.

2) Dual-mode frequency synthesizer—Since the RF frequency synthesizer only provides coarse channel selection both phase-noise and settling-time requirements are relaxed. This suggests the use of a simple integer-N PLL, rather than its fractional-N counterpart that suffers from spurs. Moreover, in an integer-N architecture, only two additional frequency dividers are sufficient to provide two different step-sizes based on a single reference clock. Therefore, the reference frequency can be kept high enough to maintain a low phase noise. FIG. 9 shows an embodiment of a frequency synthesizer suitable for operation with the circuit of FIG. 7.

3) Triple-mode channel-select filter—To achieve high dynamic range and also provide image rejection, active-RC based polyphase filters are usually the most adequate architecture, which also simultaneously allow programmability in gain, bandwidth, and center frequency. Additionally, by using some digital control, the filter can be configured as a wideband lowpass filter (LPF) for zero-IF, or a narrowband positive-/negative-complex bandpass filter (+C-BPF/−C-BPF) for low-IF. (The details will be presented in a following section.)

4) Multifunctional sampling-mixer scheme—In low-IF mode, the scheme will perform double-quadrature sampling for downconversion (i.e., I/Q phases are inherently generated digitally), channel selection and secondary image rejection. Alternatively in a zero-IF mode, the scheme performs simple baseband sampling for digitization [16]. The mode selection can be implemented again by simple digital control, and is embedded in the clock-phase generator. The overall working principle of the receiver of FIG. 7 will now be presented.

Step-1: RF AFE in Low-IF Mode

The reconfigurable receiver architecture of FIG. 7 performs channel selection in two steps. Similarly to the conventional approach in the RF AFE, the first step comprises a RF selection that will include a pre-selection filter and a low-noise amplifier (LNA) for acquiring and amplifying the required RF channels. After that, a frequency synthesizer performs the frequency downconversion at the first stage of mixers. The corresponding CSSF illustrations are shown in FIG. 10(a), with the selected IF value set to 0.5 CS and the assumption that the sought radio channels, at the first step of 2-SCS, are channels $C_N$ and $C_{N+1}$, leading to the pre-selected RF input signal $x_{RF}(t)$, $$x_{RF}(t) = C_N \cos[2\pi f_N t + \Phi_N(t)] + C_{N+1} \cos[2\pi f_{N+1} t + \Phi_{N+1}(t)] + C_{N+2} \quad (1)$$

where $C_N$, f and $\Phi$ are the envelope, frequency and phase of the radio channels, respectively. In the second step, depending on the desired channel, which will be either $C_N$ or $C_{N+1}$, two alternatives will be considered.

Step-2: IF AFE in Low-IF Modes A and B

FIGS. 10(b) and 10(d) show the second steps in low-IF modes A and B, respectively. The channel-select filter is implemented by a reconfigurable complex bandpass filter with two possible passbands ("dual-mode") that can be centered at either $-f_{IF}$ or $f_{IF}$ for selecting either channel $C_N$ or channel $C_{N+1}$, respectively. The programmable analog-double-quadrature sampling (A-DQS), performed by a multifunctional sampling-mixer, will result in either a backward (BS) or forward (FS) frequency shifting in low-IF modes A or B, respectively. A sampling frequency of four times the IF (i.e., 2 MHz in this case), [16], [17], can inherently provide frequency downconversion and sampling functions, with an additional flexibility for controlling the acquisition of either the upper or lower sideband. In forward frequency shifting, channel $C_N$ will be obtained at $\pm nf_s$ for n=0, 1, 2 . . . whereas channel $C_{N+1}$ (image of $C_N$) is shifted to $\pm nf_s/2$ for n=1, 3, 5 . . . . Similar results can also be obtained in backward frequency shifting, where the roles of channels $C_N$ and $C_{N+1}$ will be reversed. Both cases do not suffer from the DC offset and flicker noise as the frequency values are now shifted to $\pm nf_s/4$, for n=1, 3, 5 . . . . Afterwards, the y(nT) can be digitized by two Nyquist A/Ds, and the final I and Q data at a rate of $f_s/2$ can be obtained after passing through a high-order digital decimation filter for sharp-transition filtration and decimation.

Step-2: IF AFE in Zero-IF mode

With the same RF AFE, the main difference in the zero-IF mode, when compared with low-IF, relies on the baseband part. Once two narrowband channels are considered as a single wideband one, as shown in the upper part of FIG. 10(c), the local oscillator is at the same frequency as the channels' carrier in order to directly downconvert it to DC. The channel-select filter should be now in the lowpass mode. Regarding the double quadrature sampling, it will be replaced by its sub-set operation-analog-baseband sampling (A-BS). The sampling frequency $f_s$ will be increased to 10 MHz in order to match the HomeRF standard with an oversampling ratio (OSR) of two to reduce aliasing. Independently of the modes of operation, the final demodulation will be performed at DC, allowing the use of high-effective analog zero-IF GFSK demodulator [25] or digital coherent demodulator.

The remaining digital operations in zero-IF mode will be analogous to those in low-IF mode, and they can be implemented in the DSP.

Low-IF/Zero-IF Reconfigurable Receiver Design 2—IEEE 802.11a, b and g System-Design Overview Communication standards are the basis to choose architecture. For receiver (RX), 802.11b benefits from zero-IF downconversion due to its spread-spectrum and wideband characteristics, eliminates the DC offset by using capacitive interconnect will not cause a heavy distortion as long as the highpass pole is low enough, i.e., ~10 kHz. Conversely, although 802.11a and g are wideband, the OFDM technique causes removal of the low-frequency noise very problematic. Without using an automatic frequency control, a slight frequency deviation in the frequency synthesizer (FS) will place the notch on the channel sub-carriers, rather than the unwanted low-frequency disturbance. Such a problem can be facilitated by exploiting a low-IF approach with the selected IF equals to half channel spacing. Thus, the required image rejection is relaxed due to the standard guideline, i.e., the image (1st adjacent channel) is maximally only 16 dB larger than the desired one. In addition, low IF allows the use of a much relaxed highpass pole (~1.5 MHz) for the capacitive interconnect to meet the stringent response time required by 802.11a and g.

The proposed solution is to use a low-IF/zero-IF reconfigurable RX with a two-step channel selection technique, which not only able to synthesize the beneficial features of low IF and zero IF together, but also relax the specifications of the FS such as the phase noise and settling time (as described in next Subsection).

Receiver Architecture

Figure 11:
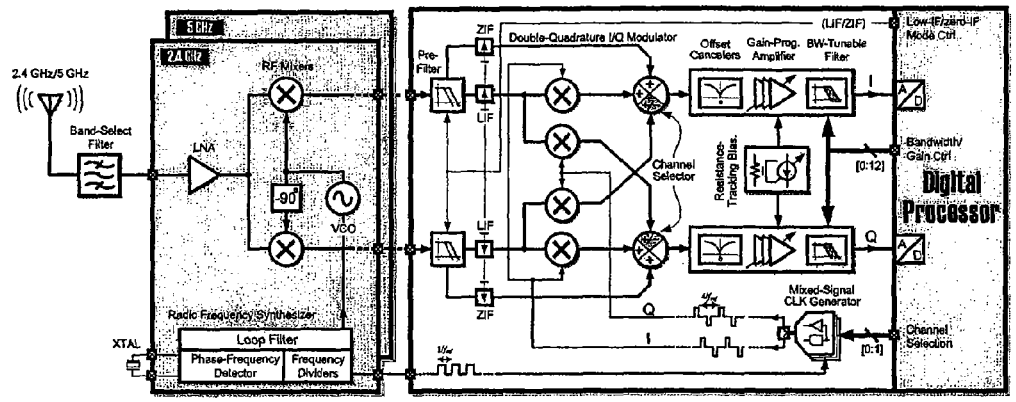
FIG. 11 shows a second embodiment of a low-IF/zero-IF reconfigurable receiver.

Such architectural considerations lead to the receiver as shown in FIG. 11. The two frequency bands, 2.4 GHz and 5 GHz, require two sets of low-noise amplifiers (LNAs) and RF mixers for amplification and RF-to-IF downconversion, respectively. The pre-filter and double-quadrature I/Q modulator offer two modes: filtering and downconversion in low-IF mode, or simply filtering with reduced bandwidth in zero-IF mode. The modulator also serves as an IF channel selector such that the whole channel selection can be partitioned efficiently between the frequency synthesizer and the modulator. The modulation signals are generated by an I/Q-mismatch insensitive mixed-signal clock generator, which includes analog and digital circuitry. The bandwidth-tunable filter purifies the channel spectrum for different bandwidths, and the gain-programmable amplifier optimizes the signal swing to fullscale for A/D conversion. Offset-cancelers are embedded in both the filter and amplifier to suppress nonlinearity, 1/f noise and DC offset. The cut-off frequency is stabilized by utilizing a resistance-tracking biasing circuit. Their different modes of operation, channel selection, gain and bandwidth controls are done by digital.

Operating Principles

Low-IF Mode

Figure 12:
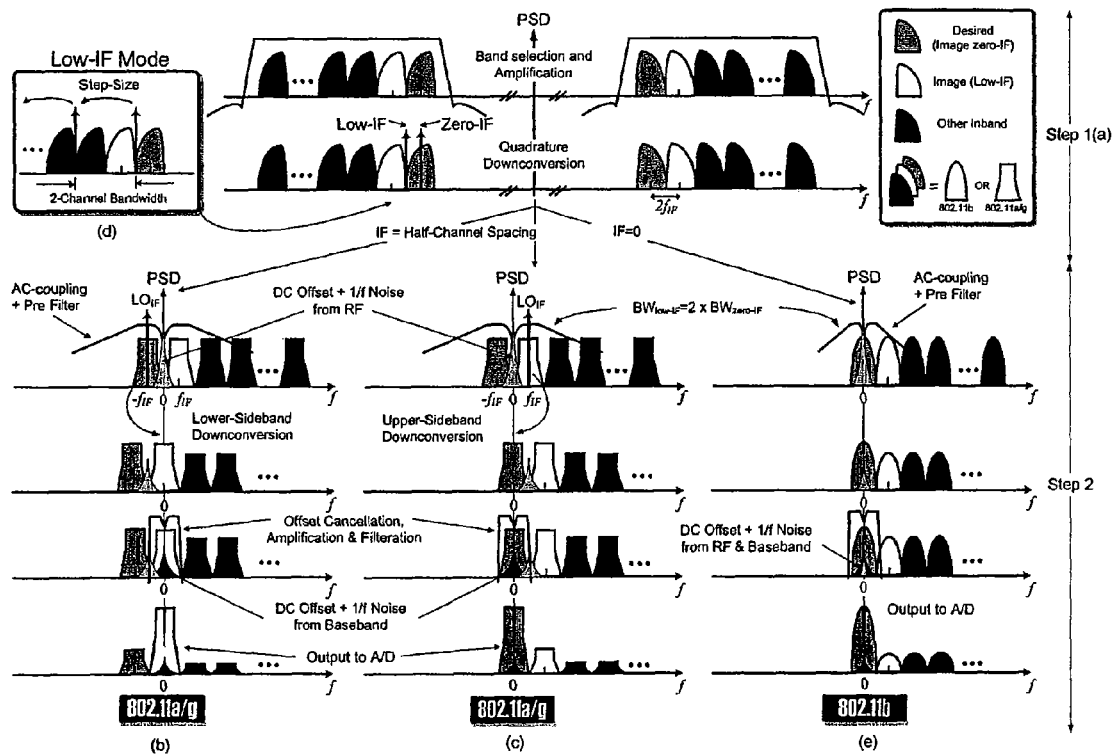
FIG. 12 shows CSSF illustrations of the receiver of FIG. 11. (a) Step-1: RF-to-IF downconversion for 802.11a/b/g. (b) Step-2: IF-to-baseband lower-sideband downconversion for 802.11a/g. (c) Step-2: IF-to-baseband upper-sideband downconversion for 802.11a/g. (d) Low-IF channel selection scenario at RF. (e) Step-2: zero-IF mode.

FIG. 12(a)-(c) describes the operation in low-IF mode pictorially. No matter the operation is for 5-GHz 802.11a or 2.4-GHz 802.11g, after amplification by the LNA, the desired channel and its image will be downconverted together to the identical IF (which is half-channel spacing) but with a complex-conjugate representation [FIG. 12(a)]. The low-frequency disturbance, located in between the desired signal and its image, is now easily cancelable by AC-coupling, whereas the high-side injected image is suppressed by the pre-filter. Now, suppose the double-quadrature I/Q modulator can flexibly select either of them from IF to baseband without using any frequency synthesizer, a channel selection is accomplished between the desired channel and its image without any prerequisite needed in the radio [FIG. 12(a)-(c)]. In the followed filter and amplifier, offset cancellation is possible as the OFDM channel has no sub-carrier at DC and the IF-to-baseband downconversion imposes very small frequency error. This coarse-at-radio fine-at-baseband channel selection, namely two-step channel selection, provides many advantageous features to the radio frequency synthesizer as described as follows:

First, the step-size of the frequency synthesizer can be doubled [FIG. 12(d)], which implies that the division ratio (also named as modulus) in the phase locked-loop (PLL) will be halved since the finally selection is done at the IF. If an integer-N PLL frequency synthesizer is utilized, the reference frequency that must be equal to the step-size can be accordingly doubled to shorten the PLL settling time and to enlarge the loop bandwidth of the PLL for suppressing the in-locked oscillator phase noise. Moreover, higher reference frequency also increases the PLL damping ratio, improving the PLL stability. Furthermore, since the division ratio is proportional to the close-in phase noise of the PLL, halving that ratio also reduces the power of the close-in phase noise by a factor of 4 and simplifies the frequency divider anatomy because half of the locking positions are saved.

Zero-IF Mode

For the 802.11b, direct downconversion is preferred [FIG. 12(e)] since offset cancellation with cutoff-frequency less than 10 kHz generates insignificant intersymbol interference (ISI). The bandwidth of the pre-filter is correspondingly reduced by a factor of 2, and the double-quadrature I/Q modulator is bypassed. The following operations including offset cancellation, filtration and amplification are all analogous to those in low-IF mode.

Reconfigurable IF AFE Design

To implement a receiver adequate for the previously referred applications (except for the simple modification needed in the frequency synthesizer presented in FIG. 9), only the IF-to-baseband functional blocks need to be reconfigured as introduced next.

Triple-Mode Channel-Select Filter

Figure 10:
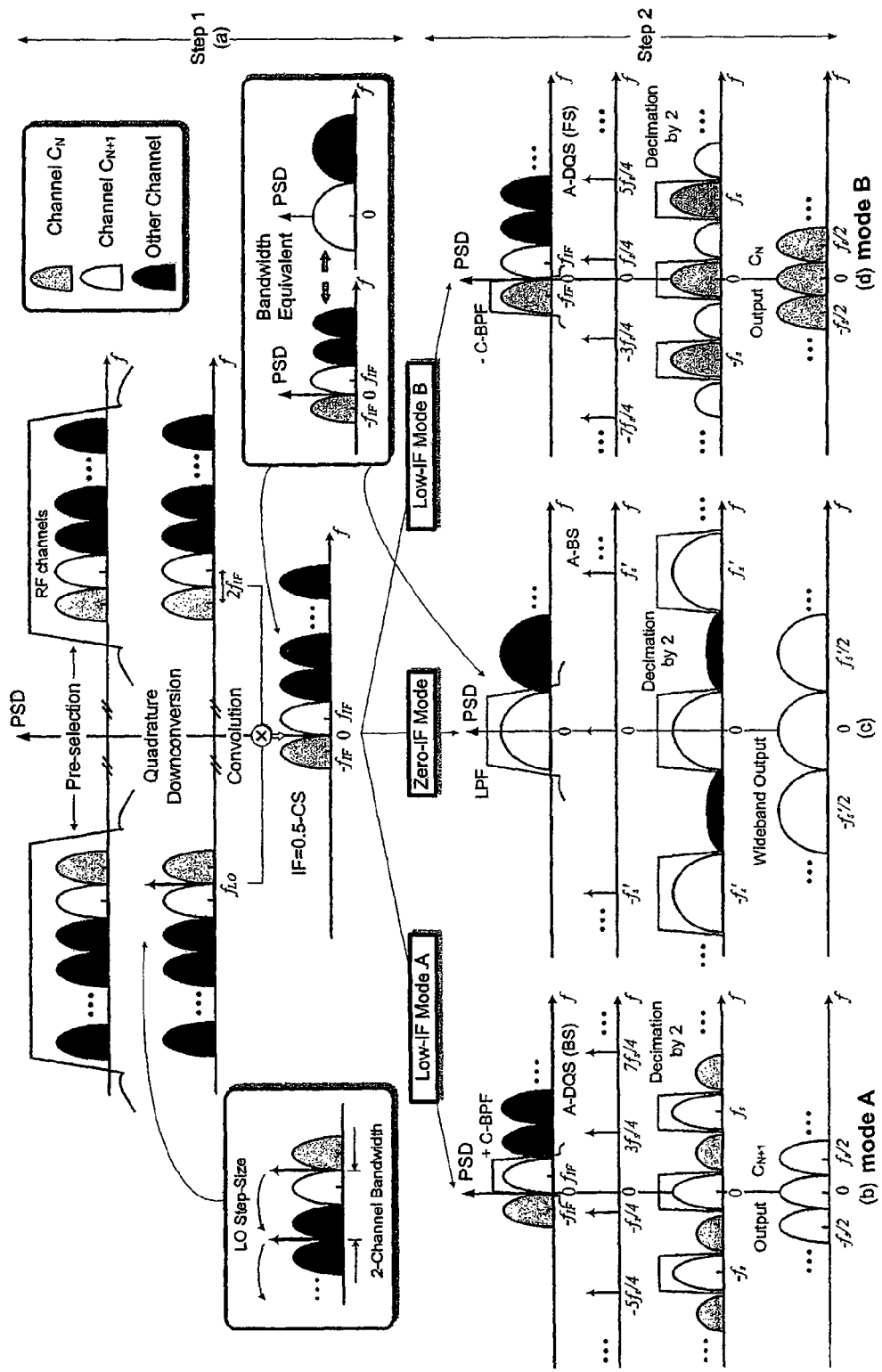
FIG. 10 shows CSSF illustrations of the receiver of FIG. 7. (a) Step-1: RF AFE. (b) Step-2: low-IF mode-A. (c) Step-2: zero-IF. (d) Step-2: low-IF mode-B.

Basic principles—To fulfill the filtering modes described in FIG. 10, only a small number of center-frequency locations are needed. By doing lowpass-to-complex-bandpass linear transformation defined by $j\omega \rightarrow j\omega - j\omega_c$ (where $\omega_c$ is the tunable center frequency), the characteristics of the filter such as phase linearity and passband ripple are all preserved after transformation. If the filter is an even $n^{th}$-order all-pole filter, the transfer function can be written as $$H(s+j\omega_c) = \prod_{i=1}^{n/2} \frac{K_i \cdot \omega_{p,i}^2}{(s+j\omega_c)^2 + (\omega_{p,i}/Q_{p,i})(s+j\omega_c) + \omega_{p,i}^2} \quad (2)$$

Figure 13:
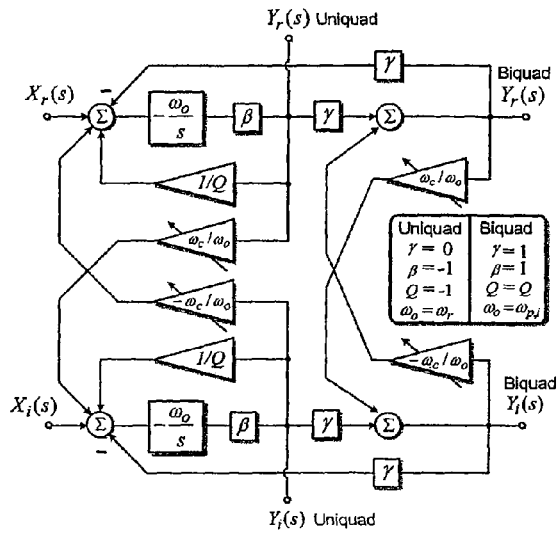
FIG. 13 shows a block diagram of center-frequency-tunable uniquad/biquad stages.

Whereas an odd $n^{th}$-order one has the form $$H(s+j\omega_c) = \quad (3)$$
$$\frac{K_r \cdot \omega_r}{(s+j\omega_c) + \omega_r} \cdot \prod_{i=1}^{(n-1)/2} \frac{K_i \cdot \omega_{p,i}^2}{(s+j\omega_c)^2 + (\omega_{p,i}/Q_{p,i})(s+j\omega_c) + \omega_{p,i}^2}$$

where $s=j\omega$, $K_i$ and $K_r$ are constants, $\omega_r$ is the real pole and $Q_{p,i}$ is the quality factor of the conjugate pole pairs with pole frequency $\omega_{p,i}$. Based on (2) and (3), the generalized block schematics of uniquad and biquad implementation can be depicted in FIG. 13. It shows that by changing the quadrature-feedback factors between I and Q channels the center frequency can be controlled to form the intended filtering modes, i.e. lowpass ($\omega_c=0$), negative ($\omega_c=-\omega_c$) or positive ($\omega_c=+\omega_c$) complex bandpass.

Implementations

Figure 14:
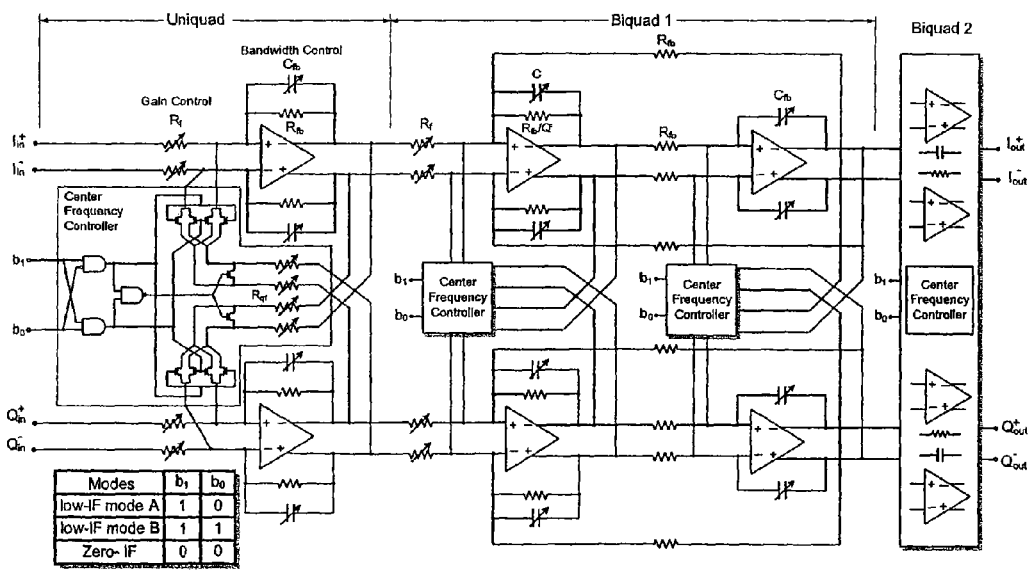
FIG. 14 shows a triple-mode CSF with active-RC realization.

Wireless transceivers require a high-linear filter for channel selection. An active-RC realization constitutes an adequate choice. FIG. 14 shows the simplified $5^{th}$-order implementation, where the complex uniquad has been obtained by modifying the circuit presented in [26] (which has been traditionally used to construct high-order polyphase filters through cascading) with the introduction of a center-frequency controller. However, to realize a higher-order Butterworth characteristic with complex poles, a novel complex biquad structure is proposed in the present disclosure, based on the Tow-Thomas architecture. By using a simple capacitor (resistor) bank [27] in the feedback capacitor $C_{fb}$'s (forward resistor $R_f$'s), the bandwidth (gain) can be digitally scaled. The filter center frequency will be set-up by a 2-bit digital controller, which organizes the MOS array of switches in such a way that it will either connect the I/Q cross-feedback resistors $R_{qf}$'s to the common-mode voltage for centering the filter at DC, or switches the differential terminals to center the filter at either $+\omega_c$ or $-\omega_c$. This type of arrangement allows the elimination of the loading effects in mode-switching (mode-A or mode-B), and reduces the distortion caused by the MOS switches since the $R_{qf}$'s are always connected to either the common-mode or the virtual ground of the op-amp. In addition, the different $R_{qf}$'s are also implemented by resistor banks allowing further enlargement of the center-frequency range of adjustability.

Another important consideration is the fact that AC-coupling does not raise any problem in both low-IF and zero-IF modes because HomeRF is wideband and the corresponding settling time requirements are very low (i.e., slow-frequency hopping, as presented in FIG. 6). For the Bluetooth and IEEE 802.11FH, since 99% of their power is concentrated in the frequency range between 70-430 kHz, this implies that either AC-coupling or a slight increase in the dynamic range of the A/D can effectively alleviate the DC offset and the flicker noise problem.

Simulation Results

Figure 15A:
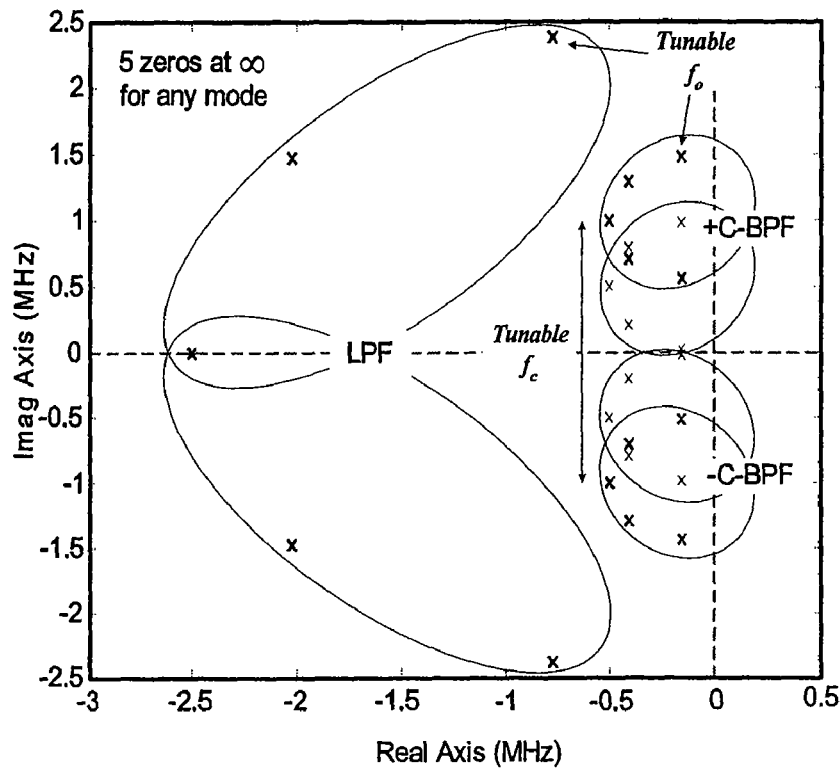
FIGS. 15(a) and 15(b) show pole-zero plot and magnitude responses of a triple-mode filter.
Figure 15B:
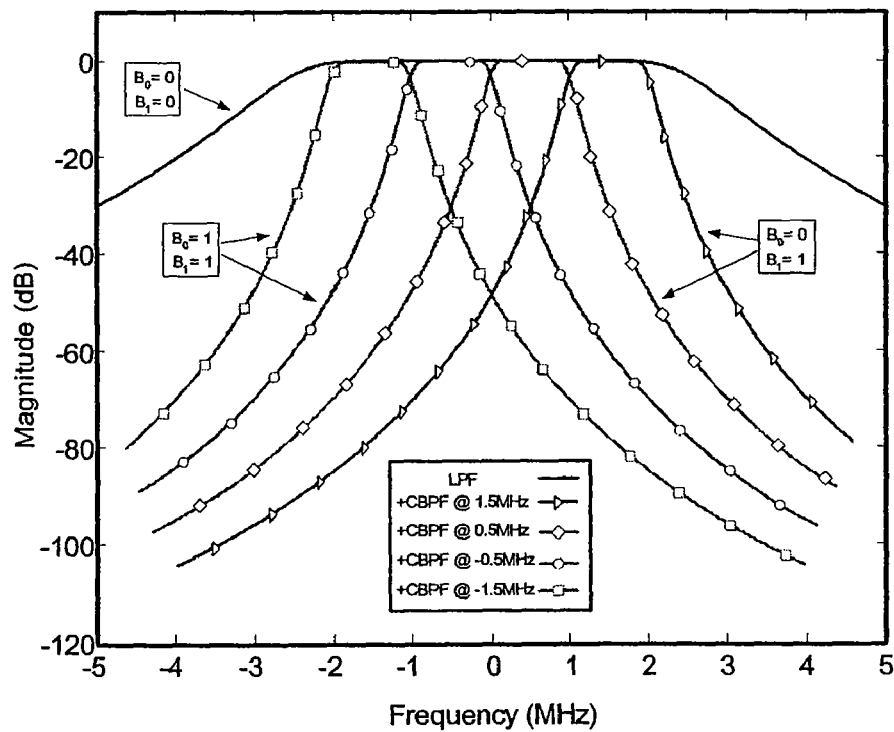

The tunable pole locations and the triple-mode simulated frequency responses of the baseband filter, obtained with the parameters of a 0.35-μm CMOS in SPECTRE, are shown in FIGS. 15(a) and (b), respectively. In zero-IF mode with 5-MHz BW, the first adjacent channel suppression is approximately 30 dB. In low-IF mode, the BW is changed to 1 MHz, and the center frequency is controlled to be at either 0.5 or 1.5 MHz to show possibility of double-IF channel selection, being the first adjacent channel rejection also approximately 30 dB.

Multifunctional Sampling-Mixer Scheme

Basic Principles

Figure 16A:
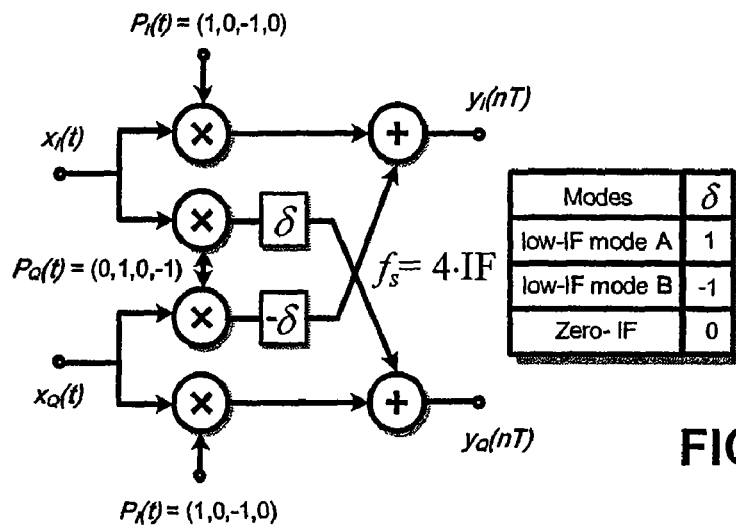
FIGS. 16(a)-(c) show (a) a block schematic of an A-DQS/A-BS; (b) a time-domain illustration of ideal and non-ideal A-DQS in low-IF mode A; (c) a non-ideal output spectrum of an A-DQS in low-IF mode A.

By employing the A-DQS technique [16] to achieve the downconversion and channel selection, no real frequency synthesizer, local oscillator and I/Q phase generator are needed. The block schematic of the multifunctional sampling-mixer scheme like the one of FIG. 7 is shown in FIG. 16(a). Firstly, in low-IF mode-A or mode-B, the sampling frequency $f_s$ ($1/T_s$) is set to 4 times the intermediate frequency, $f_{IF}$, to transform the mixing operation to a sequence of integer-weighted analog sampling of values $\cos(n\pi/2)=[1, 0, -1, 0]$ and $\sin(n\pi/2)=[0, 1, 0, -1]$. These values imply that the implementation can be differential in the analog domain [16] or sign-bit flipping between −1 and 1 in the digital domain [17] to obtain the 4-phases local oscillator signal, $$e^{\pm j2\pi f_{LO}t} = e^{\pm j\frac{\pi}{2}n} = \cos\left(\frac{\pi}{2}n\right) \pm j\sin\left(\frac{\pi}{2}n\right) \text{ for } n = 1, 2, 3 \ldots$$

The ideal complex output spectra are shown in FIGS. 10(b) and (d) for low-IF mode-A and mode-B, respectively. However, due to unavoidable gain and I/Q-time-skew mismatches between the I and Q channels, the frequency-shifting and image-rejection features of A-DQS will not be exact. Such a non-ideality can be described mathematically by a series of impulse samples represented by (consider equations (4)-(8) with lower signs for low-IF mode-A and upper signs for mode-B)

$$P(t) = P_I(t) + jP_Q(t) \quad (4)$$

$$= \sum_{n=-\infty}^{\infty} [\delta(t - nT_S) - \delta(t - nT_S - T_S - T_S/2)] + j(1 + \alpha)$$

$$\sum_{n=-\infty}^{\infty} [\pm \delta(t - nT_S - T/4 - \sigma) \mp \delta(t - nT_S + T/4 - \sigma)]$$

where α and σ (assume σ≪T/4) are the normalized gain and time-skew error between $P_I(t)$ and $P_Q(t)$, respectively.

Figure 16B:
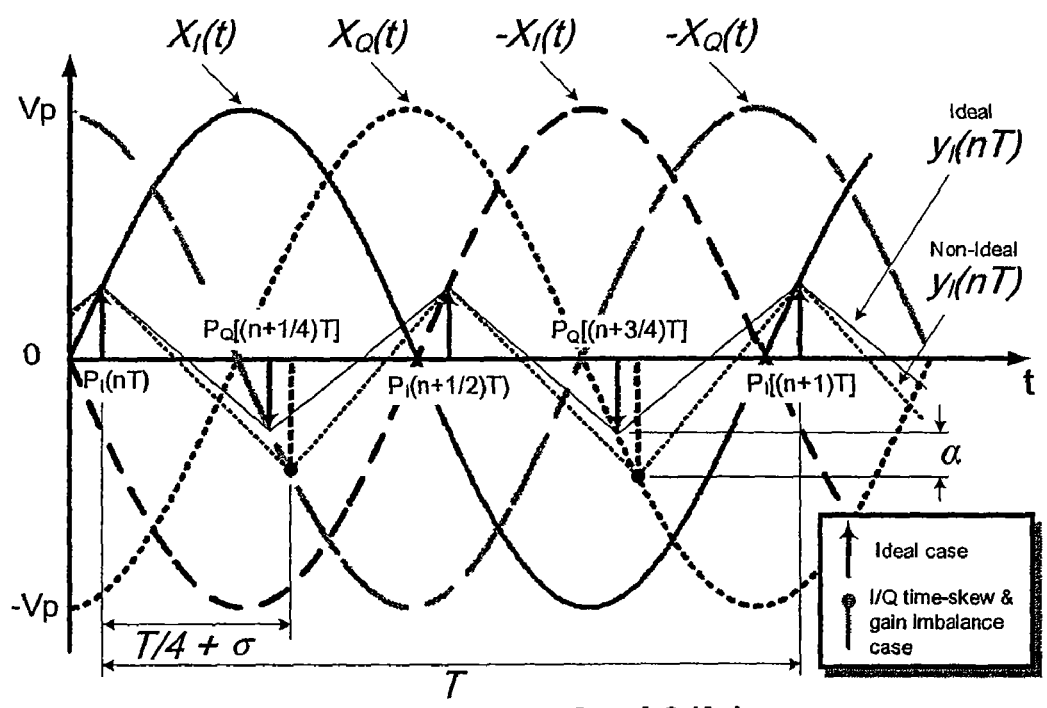
Figure 16C:
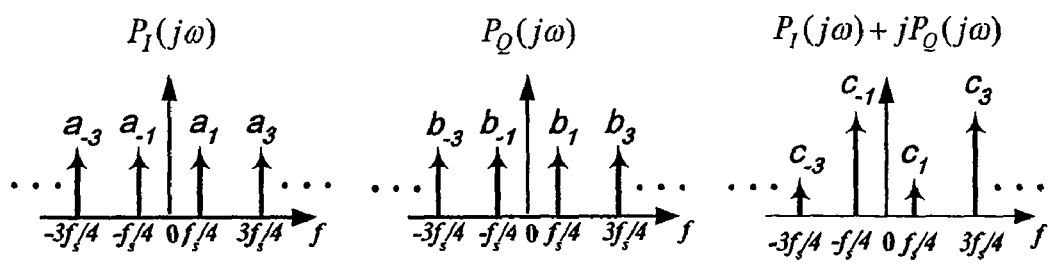

The time-domain illustration is shown in FIG. 16(b) for low-IF mode-A, where $x_I(t)=V_p \cos(\omega_{IF}t)$ and $x_Q(t)=V_p \sin(\omega_{IF}t)$ are assumed as the differential inputs, and only $y_I(nT)$ is presented for simplicity. The Fourier transform of P(t) yields, $$P(j\omega) = \sum_{k=-\infty}^{\infty} 2\pi a_k \delta(\omega - \omega_{IF}) + j \sum_{k=-\infty}^{\infty} 2\pi b_k \delta(\omega - \omega_{IF}) \quad (5)$$

$$= \sum_{k=-\infty}^{\infty} 2\pi c_k \delta(\omega - \omega_{IF})$$

where $\omega_s=2\pi f_s$, $a_k$, $b_k$ and $c_k$ are the Fourier coefficients of the real part, imaginary part, and their complex-sum, respectively, given by $$a_k = \begin{cases} \frac{2}{T} & \text{for } k = 2n + 1 \\ 0 & \text{otherwise} \end{cases} \quad (6)$$

$$b_k = \begin{cases} \frac{2}{T}(1 + \alpha)e^{-jk\pi\left(\frac{2\sigma}{T} \pm \frac{1}{2}\right)} & \text{for } k = 2n + 1 \\ 0 & \text{otherwise} \end{cases} \quad (7)$$

$$c_k = a_k + jb_k = \begin{cases} \frac{2}{T}\left[1 + (1 + \alpha)e^{-jk\pi\left(\frac{2\sigma}{T} \pm \frac{1}{2}\right)}\right] & \text{for } k = 2n + 1 \\ 0 & \text{otherwise} \end{cases} \quad (8)$$

for n=±1, ±2, ±3 . . . . The non-ideal complex output spectra, $P_I(j\omega)$, $P_Q(j\omega)$ and $P_I(j\omega)+jP_Q(j\omega)$ in low-IF mode-A are shown in FIG. 14(c), and the image-rejection ratio (IRR) can be quantified by $$IRR = \frac{|c_1|^2}{|c_{-1}|^2} = \frac{1 + (1 + \alpha)^2 + 2(1 + \alpha)\cos(\varepsilon)}{1 + (1 + \alpha)^2 - 2(1 + \alpha)\cos(\varepsilon)} \quad (9)$$

where ε is the time-skew-induced phase mismatch such that ε=2πσ/T. From (6), the IRR's are 32 dB (34 dB) for a 0.025 (0.02) relative gain mismatch when combined with 2.50 (2°) phase mismatch. These values of IRR's are practically achievable and they can be added together with the image rejection provided by the triple-mode channel-select filter providing in total ~60-dB image rejection in the IF AFE, which represents a significant improvement when compared with conventional structures that achieve usually 30 dB without tuning or trimming [28].

It is also noteworthy that the proposed sampling-mixer scheme is different from the traditional sub-sampling mixer because the sampling frequency is Nyquist and there is pre-filtering prior to the sampling. The signal-band noise floor therefore will not be increased by any sub-sampling factor due to wideband-noise aliasing [29].

In zero-IF mode, the sampling mixer is reduced to a sub-set of the previous structure, and it will be designated as analog baseband sampling (A-BS) also shown in FIG. 14(a). It can be obtained by deactivating the quadrature-phase sampler $P_Q(t)$, and changing $P_I(t)$ and $P_I(j\omega)$ to $P'_I(t)$ and $P'_I(j\omega)$, respectively, which can be expressed by $$P'_I = \sum_{n=-\infty}^{\infty} \delta(t - nT'_s) \quad (10)$$

$$P'_I(j\omega) = \sum_{k=-\infty}^{\infty} 2\pi a'_k \delta(\omega - k\omega'_k) \quad (11)$$

where $$a'_k = \begin{cases} \frac{1}{T} & \text{for } k = 0, \pm 1, \pm 2, \ldots \end{cases} \quad (12)$$

Implementations

The circuit solution implementing those sampling schemes is depicted in FIG. 17(a), which is based on a simple half-delay offset-compensated sample-and-hold (S/H) pair, which can serve as the front-end of an A/D [19], (i.e., no extra cost). In low-IF mode, the sequential clock sampling 1-4 performs the double quadrature sampling and by alternating the clock phases 2 and 4 the selection between the upper and lower sideband is achieved. Instead, in zero-IF mode, the S/H pair performs simple equal-period sampling. On the other hand, a 2-bit input digital controller will perform the selection of the different modes of operation, with the circuit structure presented in FIG. 17(b). Such a controller is composed by pure digital circuitry, and it can be efficiently embedded in the clock-phase generator to alter phase 2 and 4. The sequential clock phases 1-4 are generated via three division-by-2 circuits implemented with D-flip-flops. This approach is simple in structure and also eliminates the different propagation delays experienced in the dividers as they are synchronized in the logical operation—AND with "Edge-Trigger 1". The outputted phases A to D are subsequently passed to another simple logic circuit, which can either switch-ON/OFF through a 2-bit control code and/or rearrange the sampling sequence between 1-2-3-4 or 1-4-3-2 for channel selection. This selection will be triggered by phase A assuring that the sampling sequences are in the desired order, and also certifying that the time needed for each channel switching is 4 sampling periods. In the proposed applications with ±0.5-channel-bandwidth IF (or both ±0.5 and ±1.5), 2 µs (~0.667 µs) is required for 2-MHz (6-MHz) sampling frequency, which is only 0.32% (~0.0267%) of the channel hopping time specified in the Bluetooth standard (625 µs/hop). Such a value is already the fastest requirement, as referred in FIG. 6. The final gate-driving buffers are synchronized again by "Edge-Trigger 2" to further compress the sampling errors. Since the proposed channel-selection technique only acts transparently in the control paths in discrete-time domain, no settling transients are observed when switching, which is usually not possible in the conventional continuous-time mixing approach. The phases 5, and their early switched-off version 5', are the general non-overlapping clock phases exploited in switched-capacitor circuits to eliminate the charge injection and clock feedthrough, and more importantly here they are those that will eliminate the mismatch in the analog switches and simplify the image problem to a self-image only, and turning double quadrature sampling inherently insensitive to I/Q mismatch [30], [31].

Simulation Results

Considering that the baseband sampling is a well-known technique, its simulation results will be omitted here and only the results of double quadrature sampling in forward shifting will be addressed next.

By applying a pair of complex input signal, $C_1 e^{-j2\pi f_{in} t} + C_2 e^{j2\pi f_{in} t}$, with $f_{in}=1$ MHz and setting the sampling frequency, $f_s$, to 10 MHz, the obtained power spectrum density (PSD) of the I channel is shown in FIG. 18(a) (the Q channel's result would be identical in magnitude but different in phase). Taking the complex sum PSD |I+jQ| it will lead to the simulated results plotted in FIG. 18(b). As observed, the input is not only sampled-and-held but also forwardly shifted by 2.5 MHz ($f_s/4$) such that the sampled components, $$C_1 e^{-j2\pi n \frac{f_{in}}{f_s}} \text{ and } C_2 e^{-j2\pi n \frac{f_{in}}{f_s}},$$

will be located at $$nf_s + \frac{f_s}{4} + f_{in} \text{ and } nf_s + \frac{f_s}{4} - f_{in} \text{ for } n = 1, 2, 3 \ldots,$$

respectively. The attenuation of their magnitudes is due to the sample-and-hold effect. Through optimum system-to-transistor-level design, the image-rejection simulations based on certain artificial mismatch assignments, on the I and Q channels, achieved IRR=41 dB/50 dB/76 dB for 2% gain, 0.5° phase and 2% capacitance mismatches, respectively [19].

Direct-Up/Two-Step-Up Reconfigurable Transmitter

Figure 19:
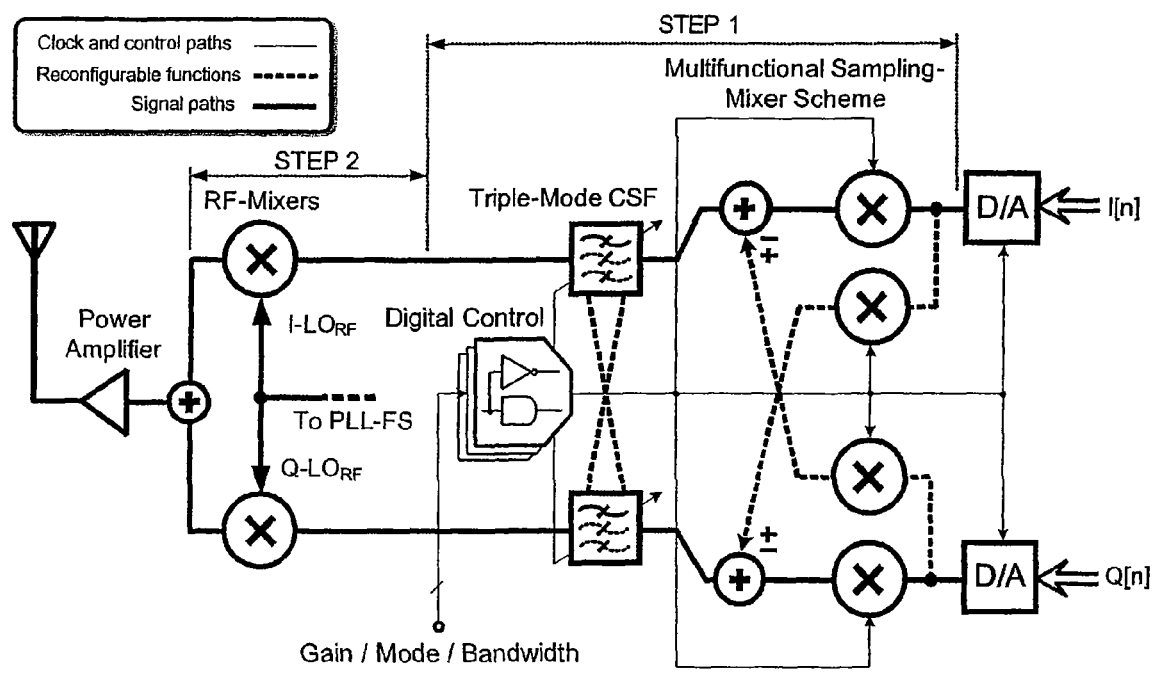
FIG. 19 shows an embodiment of a direct-up/two-step-up reconfigurable transmitter.

The proposed technique implemented in a receiver can be analogously adopted in a transmitter to allow one PLL frequency synthesizer per transceiver that shares the same phase noise and settling time relaxations. As depicted in FIG. 19, a mixed architecture of the direct-up and two-step-up transmitter is presented. In direct-up mode, single upconversion has a simple and efficient architecture, but it suffers from LO-pulling as the frequency of the LO is the same as the desired frequency location. In two-step-up mode, the first IF is set to 0.5 CS to reduce the effect of LO-LO self-modulation at RF since the LO frequency can be offset from the RF signal frequency. Regarding the IF value, again, it can be selected as either a positive or negative IF, like in the receiver path, through the developed multifunctional sampling-mixer scheme. Differently from a conventional two-step-up transmitter [32], the A-DQS upconversion can be embedded into the S/H units of typical switched-capacitor digital-to-analog converters (D/As), or implemented in current mode for current-steering D/As [21]. The lowpass filter used in the conventional case [32] can be replaced by the proposed triple-mode filter which rejects, simultaneously, the residue images due to sample-and-hold effects and I/Q mismatch. Moreover, with capacitive coupling embedded in the cascaded stages, flicker noise and DC offset generated from the filters can be suppressed without degrading the signal quality, because the signal has been now frequency shifted to the IF prior filtering. The final upconversion is carried in the second step as usual.

CONCLUSIONS

As the multistandard compatibility of wireless terminals becomes much more imperative than before, the standalone operation of either low-IF or zero-IF receivers will no longer be adequate enough to support narrowband-wideband-mixed multistandard applications. The two-step channel-selection technique in accordance with the present disclosure allows combining the beneficial features of low-IF and zero-IF implementations together in one reconfigurable receiver. As a result, with only small alteration needed in the RF AFE (two frequency dividers added to the frequency synthesizer), both narrowband and wideband signals can be processed flexibly in their respectively preferred low-IF and zero-IF operating modes. Additionally, the technique also relaxes the frequency synthesizer and local oscillator design difficulties through channel-selection partitioning between the RF and IF AFEs, and balance the design tradeoffs between image rejection and low-frequency disturbance eliminations. Those techniques and functional blocks are also transformable to the transmitter design to form an equally flexible direct-up/two-step-up reconfigurable transmitter. The table in FIG. 20 shows comparative results to illustrate the versatility of the developed receiver and transmitter against the conventional ones. All the new techniques developed here form the cornerstone for our future developments of a complete multistandard transceiver.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

REFERENCES

[1] P.-I. Mak, S.-P. U and R. P. Martins, "Two-Step Channel Selection—A Novel Technique for Reconfigurable Multi-standard Transceiver Front-Ends," IEEE Trans. on CAS-I, vol. 52, No. 7, pp. 1302-1315, July 2005.

[2] J. Rogin, I. Kouchev, G. Brenna, D. Tschopp and Q. Huang, "A 1.5-V 45-mW direct-conversion WCDMA receiver IC in 0.13-μm CMOS," *IEEE J. of Solid-State Circuits*, vol. 38, no. 12, pp. 2239-2248, December 2003.

[3] T. Rühlicke, M. Zannoth and B.-U. Klepser, "A highly integrated, dual-mode, multi-mode wireless LAN transceiver," in *Proc. of Euro. Solid-State Circuits Conf.(ESS-CIRC)*, pp. 229-232, September 2003.

[4] P.-I. Mak, W.-I. Mok, S.-P. U and R. P. Martins, "I/Q imbalance modeling of quadrature transceiver analog front-ends in SIMULINK," in *Proc. of IEEE Int. Conf. on Vehicular Technology (VTC)*, vol. 4, pp. 2371-2374, October 2003.

[5] J. Crols and M. Steyaert, "A single-chip 900 MHz CMOS receiver front-end with a high performance low-IF topology," *IEEE J. of Solid-State Circuits*, vol. 30, no. 12, pp. 1483-1492, December 1995.

[6] W. Sheng, et al., "A 3-V, 0.35-μm CMOS Bluetooth receiver IC," *IEEE J. of Solid-State Circuits*, vol. 38, no. 1, pp. 30-42, January 2003.

[7] T. Kadoyama, et al., "A complete single-chip GPS receiver with 1.6-V 24-mW Radio in 0.18-μm CMOS," *IEEE J. of Solid-State Circuits*, vol. 39, no. 4, pp. 562-568, April 2004.

[8] M. Steyaert, J. Janssens, B. D. Muer, M. Borremans and N. Itoh, "A 2-V CMOS cellular transceiver front-end," *IEEE J. of Solid-State Circuits*, vol. 35, no. 12, pp. 1895-1907, December 2000.

[9] P. Choi, et al., "An experimental coin-sized radio for extremely low power WPAN (IEEE 802.15.4) application at 2.4 GHz," *IEEE J. of Solid-State Circuits*, vol. 38, no. 12, pp. 2258-2268, December 2003.

[10] J. Ryynänen, et al., "A single-chip multimode receiver for GSM900, DCS1800, PCS1900, and WCDMA," *IEEE J. of Solid-State Circuits*, vol. 38, no. 4, pp. 594-602, April 2003.

[11] H. Darabi, et al., "A dual-mode 802.11b/Bluetooth radio in 0.35-μm CMOS," in *Int. Solid-State Circuits Conf. (ISSCC), Digest.*, pp. 86-87, February 2003.

[12] M. Zannoth, T. Ruhlicke, B.-U. Klepser, "A highly integrated dual-band multimode wireless LAN transceiver," IEEE J. of Solid-State Circuits, vol. 39, no. 7, pp. 1191-1195, July 2004.

[13] Leon W. Couch II, *Digital and Analog Communication Systems*, Prentice Hall, Inc, 1987.

[14] J. C. Rudell, et al., "A 1.9-GHz wide-band IF double conversion CMOS receiver for cordless telephone applications," *IEEE J. of Solid-State Circuits*, vol. 32, no. 12, pp. 2071-2088, December 1997.

[15] B. Razavi, "Architectures and circuits for RF CMOS receivers," in *Proc. of Custom Integrated Circuits Conf. (CICC)*, pp. 393-400, May 1998.

[16] P.-I. Mak, S.-P. U and R. P. Martins, "A novel IF channel selection technique by analog double-quadrature sampling for complex low-IF receivers," in *Proc. of Int. Conf. on Communication Technology (ICCT)*, vol. 2, pp. 1238-1241, April 2003.

[17] P.-I. Mak, S.-P. U and R. P. Martins, "Two-step channel selection technique by programmable digital double-quadrature sampling for complex low-IF receivers," *IEE Electronics Letters*, vol. 39, no. 11, pp. 825-827, May 2003.

[18] P.-I. Mak, S.-P. U and R. P. Martins, "A programmable switched-capacitor A-DQS frequency downconverter for two-step channel selection wireless receiver," in *Proc. of the 5th IEEE Int. Conf. on ASIC (ASICON)*, vol. 1, pp. 573-576, October 2003.

[19] P.-I. Mak, C.-S. Sou, S.-P. U and R. P. Martins, "A frequency-downconversion and channel-selection A-DQS sample-and-hold pair for two-step-channel-select low-IF receiver," in *Proc. of IEEE Int. Conf. on Electronics, Circuits and Systems (ICECS)*, pp. 479-482, December 2003.

[20] P.-I. Mak, S.-P. U and R. P. Martins, "A low-IF/zero-IF reconfigurable receiver with two-step channel selection technique for multistandard applications," in *Proc. of IEEE Int. Symp. on Circuits and Systems (ISCAS)*, pp. 417-420, May 2004.

[21] K.-H. Ao Ieong, C.-Y. Fok, P.-I. Mak, S.-P. U and R. P. Martins, "A Frequency Up-Conversion and Two-Step Channel Selection Embedded CMOS D/A Interface," in *Proc. of IEEE Int. Symp. on Circuits and Systems (ISCAS)*, Japan, May 2005, pp. 392-395.

[22] P.-I. Mak, et al., "An I/Q-multiplexed and OTA-shared CMOS pipelined ADC with an A-DQS S/H front-end for two-step-channel-select low-IF receiver," in *Proc. of IEEE Int. Symp. on Circuits and Systems (ISCAS)*, pp. 1068-1071, May 2004.

[23] H. A. Alzaher, H. O. Elwan and M. Ismail, "A CMOS highly linear channel-select filter for 3G multistandard integrated wireless receivers," *IEEE J. of Solid-State Circuits*, vol. 37, pp. 27-37, January 2002.

[24] Wireless Resources Center, http://www.palowireless.com.

[25] S. Samadian, R. Hayashi and A. A. Abidi, "Low power phase quantizing demodulators for a zero-IF Bluetooth receiver," in *IEEE Symp. on Radio Frequency Integrated Circuits (RFIC)*, pp. 49-52, June 2003.

[26] J. Crols and M. Steyaert, "An analog integrated polyphase filter for a high performance low-IF receiver," in *Proc. of VLSI Circuits Symp.*, Kyoto, pp. 87-88, June 1995.

[27] A. M. Durham, J. B. Hughes and W. R. White, "Circuit architecture for high linearity monolithic continuous-time filtering," *IEEE Trans. on Circuits and Systems-II*, vol. 39, no. 9, September 1992.

[28] A. A. Abidi, "RF CMOS comes of age," *IEEE J. of Solid-State Circuits*, vol. 39, no. 4, pp. 549-561, April 2004.

[29] D. H. Shen, C.-M. Hwang, B. Lusignan, and B. A. Wooley, "A 900 MHz integrated discrete-time filtering RF frontend," in *Int. Solid-State Circuits Conf. (ISSCC), Digest.*, pp. 54-55, Feb. 1996.

[30] K.-P. Pun, J. E. Franca, C. A. Leme and R. Reis, "Quadrature sampling schemes with improved image rejection," *IEEE Trans. on Circuits and Systems-II*, vol. 50, no. 9, pp. 641-648, September 2003.

[31] P.-I. Mak, S.-P. U and R. P. Martins, "A front-to-back-end modeling of I/Q mismatch effects in a complex-IF receiver for image-rejection enhancement," in *Proc. of IEEE Int. Conf. on Electronics, Circuits and Systems (ICECS)*, pp. 631-634, December 2003.

[32] J. A. Weldon, et al., "A 1.75-GHz Highly Integrated Narrow-Band CMOS Transmitter With Harmonic-Rejection Mixers," *IEEE J. of Solid-State Circuits*, vol. 36, pp. 2003-2015, December 2001.

What is claimed is:

1. A reconfigurable transmitter capable of operating in a direct-up mode or a two-step-up mode, wherein in the direct-up mode the intermediate frequency IF=0, the transmitter comprising:
   a baseband to intermediate frequency upconverter to perform baseband to intermediate frequency upconversion of a signal to either a positive IF or negative IF in the two-step-up mode, the upconverter being-bypassed in the direct-up mode;
   an intermediate frequency to radio frequency upconverter and a local oscillator to perform intermediate frequency to radio frequency upconversion; and
   a frequency synthesizer having a step size larger than one channel spacing; and
   a triple-mode channel-selection filter (CSF) with the center frequency reconfigurable between negative IF, zero IF, and positive IF;
   wherein the IF is set to 0.5 CS, where CS represents a channel spacing.

2. The transmitter of claim 1, wherein the frequency synthesizer has a number of locking positions inferior to a total number of channels that are being upconverted.

3. The transmitter of claim 1, wherein the local oscillator is provided with 0° and 90° phase shifts, to allow downconversion of the plurality of channels in two parallel paths having a 90° phase difference.

4. The transmitter of claim 1, further comprising a channel selection filter, the channel selection filter having a first mode wherein a desired channel is selected at a positive intermediate frequency in the two-step-up mode, a second mode where the desired channel is selected at a negative intermediate frequency in the two-step-up mode, and a third mode where the desired channel is selected at baseband in the direct-up mode.

5. The transmitter of claim 1, wherein the local oscillator is provided with 0°, 90°, 180° and 270° phase shifts, to allow upconversion of a desired channel to positive or negative intermediate frequency.

6. The transmitter of claim 1, further comprising a digital to analog converter located downstream of the oscillator.

7. The transmitter of claim 1 wherein, in the two-step-up mode, IF=(n+0.5) CS, CS being the channel spacing, n=0, 1, 2, 3 . . . .

8. The transmitter of claim 1, wherein the local oscillator is a digital clock generator, and wherein channel selection is performed inside the digital clock generator.

9. The transmitter of claim 1, wherein the baseband to intermediate frequency upconverter is a double-quadrature sampling-mixer arrangement.

10. The transmitter of claim 1, wherein the frequency synthesizer comprises an integer-N phase locked loop (PLL) and frequency dividers for channel selection.

11. The transmitter of claim 1, wherein the baseband to intermediate frequency upconverter is embedded into sample and hold units of a digital to analog converter to efficiently combine double-quadrature mixing and sample and hold functions.

12. The transmitter of claim 1, further comprising digital control for selecting a mode for the triple-mode channel-selection filter (CSF).

* * * * *